United States Patent
Fukuhara

(10) Patent No.: US 10,574,921 B2
(45) Date of Patent: Feb. 25, 2020

(54) IMAGING ELEMENT AND IMAGING APPARATUS

(71) Applicant: Sony Corporation, Tokyo (JP)

(72) Inventor: Takahiro Fukuhara, Kanagawa (JP)

(73) Assignee: Sony Corporation, Tokyo (JP)

( * ) Notice: Subject to any disclaimer, the term of this patent is extended or adjusted under 35 U.S.C. 154(b) by 37 days.

(21) Appl. No.: 15/783,775

(22) Filed: Oct. 13, 2017

(65) Prior Publication Data

US 2018/0048840 A1  Feb. 15, 2018

Related U.S. Application Data

(63) Continuation of application No. 14/460,859, filed on Aug. 15, 2014, now Pat. No. 9,819,887.

(30) Foreign Application Priority Data

Sep. 5, 2013  (JP) .................. 2013-183600

(51) Int. Cl.
| | |
|---|---|
| *H04N 5/378* | (2011.01) |
| *H01L 27/146* | (2006.01) |
| *H04N 9/04* | (2006.01) |
| *H01L 27/30* | (2006.01) |

(52) U.S. Cl.
CPC ....... *H04N 5/378* (2013.01); *H01L 27/14647* (2013.01); *H04N 9/045* (2013.01); *H01L 27/307* (2013.01)

(58) Field of Classification Search
CPC .. H04N 5/378; H04N 9/045; H01L 27/14647; H01L 27/307
See application file for complete search history.

(56) References Cited

U.S. PATENT DOCUMENTS

| | | | |
|---|---|---|---|
| 7,709,775 B2 | 5/2010 | Konno et al. | |
| 7,990,424 B2 | 8/2011 | Chiba et al. | |
| 8,035,181 B2 | 10/2011 | Ishimura et al. | |
| 8,203,155 B2 | 6/2012 | Wang et al. | |
| 9,373,732 B2 | 6/2016 | Velichko et al. | |
| 2004/0259010 A1 | 12/2004 | Kanbe | |
| 2007/0125934 A1* | 6/2007 | Matthews | H01L 27/14667 250/208.1 |
| 2008/0062290 A1* | 3/2008 | Lahav | H01L 27/14621 348/280 |
| 2012/0050554 A1 | 3/2012 | Levine et al. | |
| 2012/0104235 A1 | 5/2012 | Sumi et al. | |

FOREIGN PATENT DOCUMENTS

JP  2007-104113 A  4/2007

\* cited by examiner

*Primary Examiner* — Tony Ko
(74) *Attorney, Agent, or Firm* — Michael Best & Friedrich LLP

(57) ABSTRACT

An imaging element includes a laminated plurality of photoelectric conversion units, and an input light reflecting unit which reflects light beams input from the plurality of photoelectric conversion units toward directions of the plurality of photoelectric conversion units.

20 Claims, 18 Drawing Sheets

FIG. 7

| | MATERIAL | REFLECTIVITY |
|---|---|---|
| MATERIAL WITH REGULAR REFLECTIVITY | MIRROR SURFACE | 93 |
| | ALUMINUM ELECTROLYTIC POLISHED SURFACE | 90 TO 95 |
| | GLASS MIRROR SURFACE (ALUMINUM ALLOY) | 80 TO 85 |
| | MERCURY, ALUMINUM | 70 TO 75 |
| | GOLD, CHROMIUM, NICKEL, PLATINUM, TIN | 60 TO 70 |
| | COPPER, STEEL, TUNGSTEN | 50 TO 60 |
| | TIN BOX, SILVER BOX, ALUMINUM BOX | 20 TO 30 |
| | TRANSPARENT GLASS | 10 TO 12 |
| | BLACK GLASS | 5 |
| | WATER SURFACE | 2 |
| DIFFUSIBLE MATERIAL — METAL AND GLASS | MAGNESIUM CARBONATE (SPECIALLY MADE, BASED ON REFLECTIVITY) | 98 |
| | BARIUM SULFATE | 93 |
| | ALUMINUM OXIDE | 80 TO 85 |
| | ALUMINUM LACQUER | 60 TO 70 |
| | MATT ALUMINUM | 60 TO 80 |
| | ROUGH SURFACE CHROMIUM | 50 TO 60 |
| | GALAVANIZED IRON PLATE (NEW) | 30 TO 40 |
| | OPAL GLASS (WHOLE MILK) | 60 TO 70 |
| | SUKIGAKE GLASS | 30 TO 40 |
| | FROSTED GLASS, FIGURED GLASS | 15 TO 25 |
| DIFFUSIBLE MATERIAL — PAINT | WHITE PAINT, ENAMEL, ENAMEL | 70 TO 85 |
| | GENERAL LIGHT COLOR PAINT | 30 TO 70 |
| | GENERAL DARK COLOR PAINT | 15 TO 40 |
| DIFFUSIBLE MATERIAL — PAPER | WHITE PAPER: JAPANESE PAPER | 85 TO 91 |
| | WHITE PAPER: BLOTTING PAPER, KENT PAPER, JAPANESE TORINOKO PAPER | 70 TO 80 |
| | WHITE ART PAPER | 60 TO 65 |
| | ROUGH WHITE PAPER (SHOJI PAPER) | 30 TO 50 |
| | TRACING PAPER | 20 TO 25 |
| | NEWSPRINT | 40 TO 50 |
| | LIGHT COLOR WALL PAPER, GENERAL FUSUMA PAPER | 40 TO 70 |
| | DARK COLOR WALL PAPER, GENERAL FUSUMA PAPER | 20 TO 40 |
| | KRAFT PAPER | 25 TO 35 |
| | BLACK PAPER | 5 TO 10 |
| | BLACK PAPER (FOR COLOR CHIP) | 1 TO 5 |
| DIFFUSIBLE MATERIAL — CLOTH | WHITE CLOTH: FLANNEL, FUJI SILK | 60 TO 70 |
| | WHITE CLOTH: COTTON, LINEN | 40 TO 70 |
| | LIGHT COLOR CURTAIN | 30 TO 50 |
| | TRACING CLOTH | 25 TO 30 |
| | DARK COLOR TRACING CLOTH | 20 TO 30 |
| | BLACK CLOTH: CLOTHING FABRIC | 7 TO 15 |
| | BLACK CLOTH: COTTON, SATIN | 2 TO 3 |
| | BLACK CLOTH: VELVET | 0.4 TO 3 |

FIG. 8

| | MATERIAL | REFLECTIVITY |
|---|---|---|
| DIFFUSIBLE MATERIAL — WOOD AND WOODEN PART FOR BUILDING | PAULOWNIA (NEW) | 65 TO 75 |
| | CYPRESS (NEW) | 55 TO 65 |
| | CEDAR (NEW) | 30 TO 50 |
| | CEDAR PLATE (NEW) | 25 TO 35 |
| | CLEAR LACQUER BRIGHT COLOR MACHINED SURFACE | 40 TO 60 |
| | COLORED LACQUER, VARNISH | 20 TO 40 |
| | OUTER WALL PLANKING (NEW) | 40 TO 55 |
| | OUTER WALL PLANKING (OLD) | 10 TO 30 |
| | OUTER WALL PLANKING, OIL STAIN | 10 TO 20 |
| STONE MATERIAL AND WALL MATERIAL | WHITE TILE | 70 TO 80 |
| | LIGHT COLOR TILE | 50 TO 70 |
| | WHITE MARBLE | 50 TO 60 |
| | GREY COLOR MANUFACTURED STONE | 30 TO 50 |
| | GREY COLOR BRICK (NEW) | 30 TO 40 |
| | GENERAL STONE MATERIAL | 25 TO 50 |
| | RED BRICK (NEW) | 25 TO 35 |
| | CONCRETE, CEMENT TILE, GREY SLATE | 20 TO 30 |
| | DARK COLOR TILE, DARK COLOR MANUFACTURED STONE, SAME TILE, SAME SLATE | 10 TO 20 |
| | GREY COLOR FLAGSTONE | 5 TO 15 |
| | RED BRICK (OLD) | 5 TO 10 |
| | WHITE PLASTER WALL (NEW) | 75 TO 85 |
| | YELLOW OTSU WALL | 70 TO 75 |
| | GENERAL WHITE WALL | 55 TO 75 |
| | SAOTSU, GENERAL BROWN WALL | 40 TO 60 |
| | JAPANESE STYLE SAND COATED WALL (BROWN OR GREY) | 20 TO 40 |
| | GENERAL DARK COLOR WALL | 15 TO 25 |
| | JAPANESE STYLE SAND COATED WALL (GREEN OR DARK COLOR) | 5 TO 15 |
| FLOOR MATERIAL | MAT (NEW) | 50 TO 60 |
| | GREY COLOR VINYL TILE, ASTILE | 40 TO 70 |
| | DARK COLOR | 10 TO 20 |
| GROUND SURFACE | GRAVEL, CONCRETE, PAVING STONE | 15 TO 30 |
| | ASPHALT PAVEMENT | 15 TO 20 |

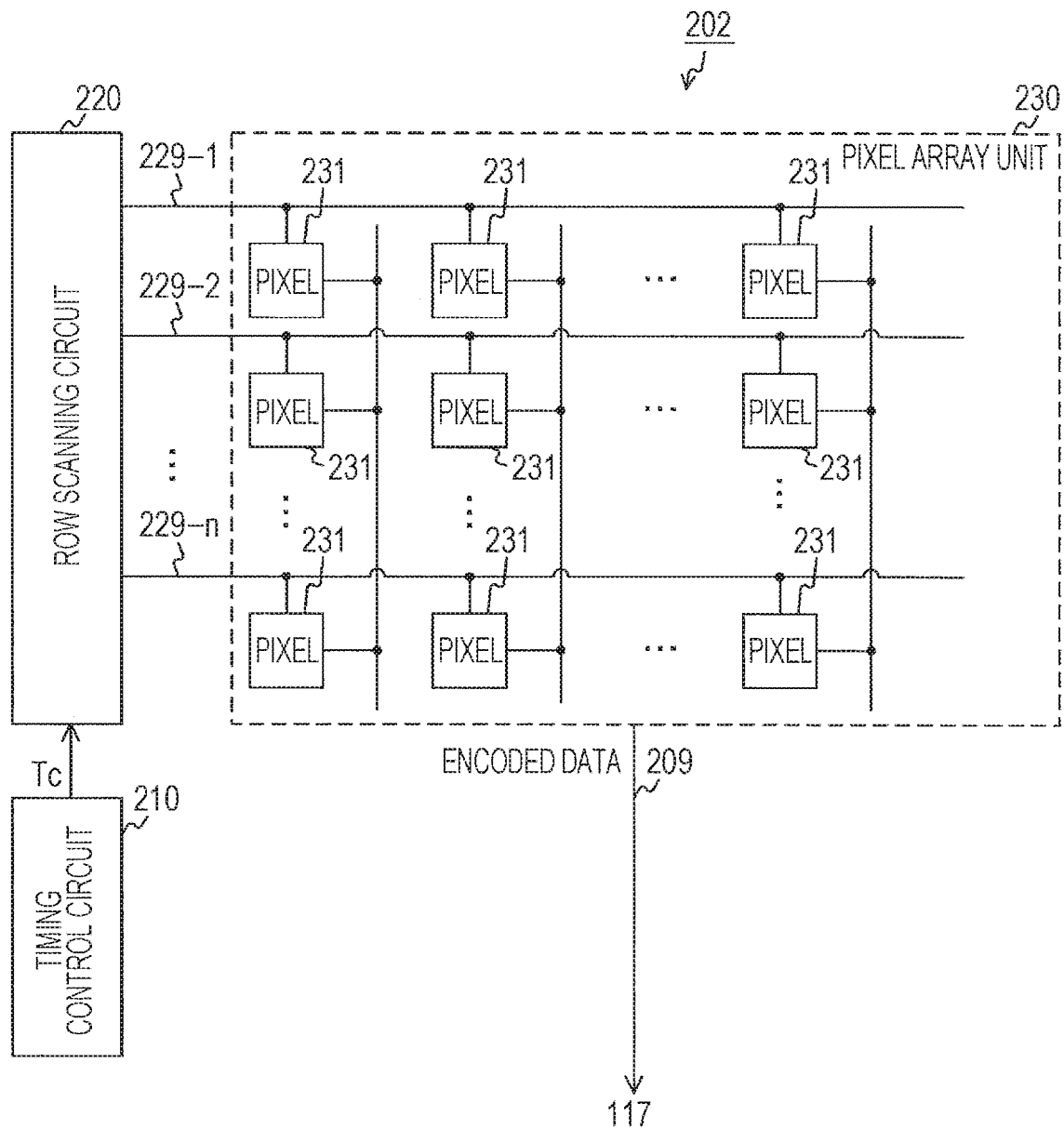

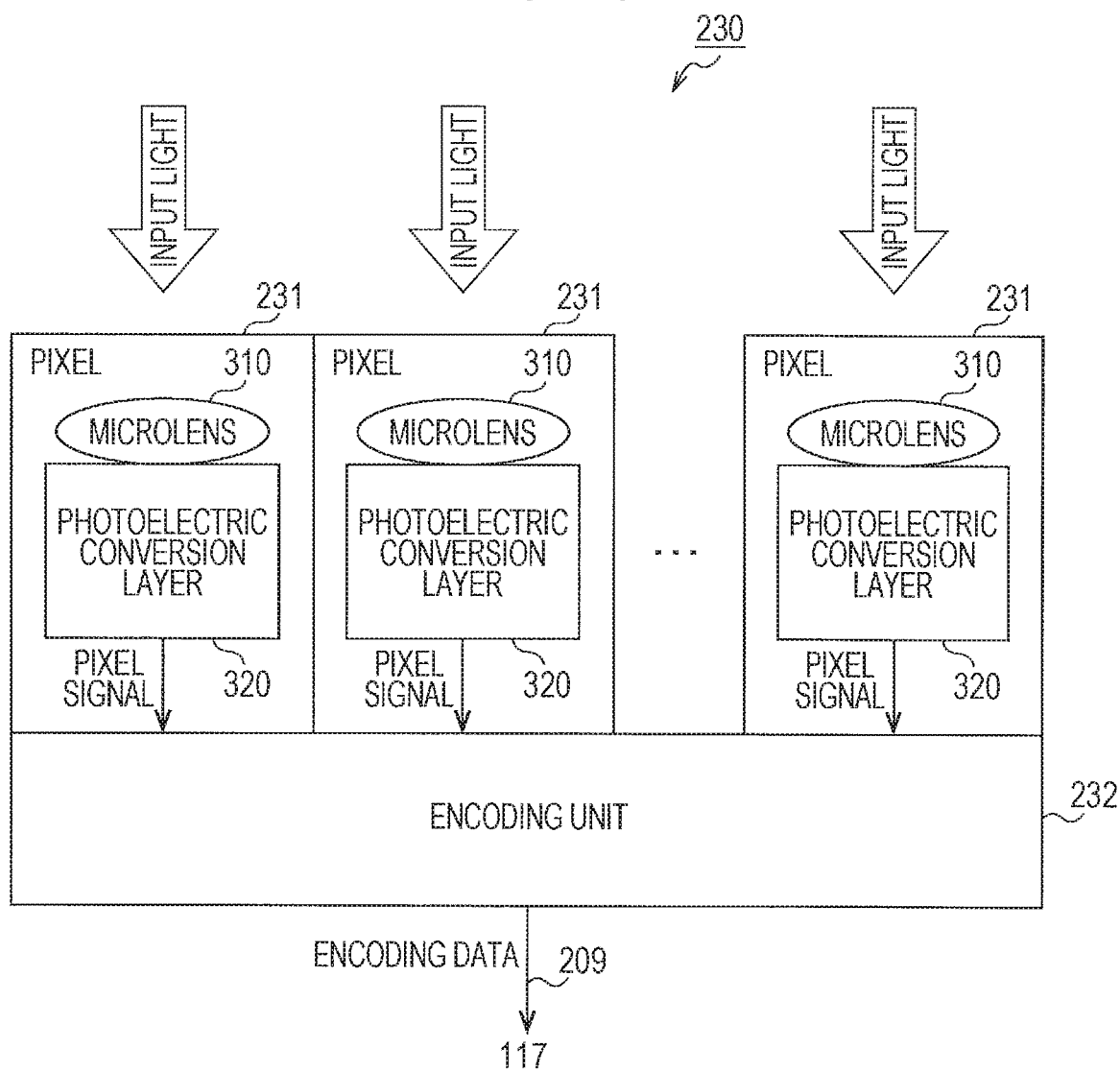

IMAGING ELEMENT AND IMAGING APPARATUS

CROSS REFERENCE TO RELATED APPLICATIONS

This present application is a Continuation of application Ser. No. 14/460,859, filed Aug. 15, 2014, and claims the benefit of Japanese Priority Patent Application JP 2013-183600 filed Sep. 5, 2013, the entire contents of which are incorporated herein by reference.

BACKGROUND

The present technology relates to an imaging element and an imaging apparatus. Specifically, the present technology relates to an imaging element and an imaging apparatus in which photoelectric conversion units are laminated.

In the related art, an imaging element for imaging an image is used in an imaging apparatus such as a digital camera or a camcorder. The imaging element includes a photoelectric conversion element which converts light into an electrical signal, various transistors, or the like. As the photoelectric conversion element which is used in the imaging element, a photodiode is well known. In an imaging apparatus which uses the photodiode, a single plate method in which one imaging element is arranged in the apparatus, and a three plate method in which three imaging elements are arranged are frequently used.

In the single plate method, color filters which transmit only any light of red (R), green (G), and blue (B) are arranged using a Bayer array on each pixel of the imaging element. On the other hand, in the three plate method, a prism which performs spectral dispersion of R, G, and B light is arranged along with three imaging elements, the R light is guided to the first imaging element, the G light is guided to the second imaging element, and the B light is guided to the third imaging element.

By adopting the above described configuration, RAW image data with any information of R, B, and G is obtained in each pixel in the single plate method. In the single plate method, when generating a full color image with all of information of R, G, and B in each pixel, it is necessary to perform demosaic processing in which the RAW image data is converted into full color image data. In contrast to this, in the three plate method, full color image data is obtained without performing the demosaic processing. It is possible to obtain an image with a good image quality when adopting the three plate method since it is not necessary to perform the demosaic processing in which deterioration in image quality might occur, however, it is difficult to miniaturize the imaging apparatus since it is necessary to arrange three imaging elements.

In this manner, in the imaging element using the photodiode, it is difficult to make miniaturization of the imaging apparatus and a high quality of an image compatible, however, in recent years, study for using an organic photoelectric conversion film containing an organic material instead of the photodiode has been actively performed in order to make these compatible.

When using the organic material, it is possible to realize a photoelectric conversion film which converts only any light of R, G, and B into an electrical signal, and transmits light other than that. For example, an imaging element in which an organic photoelectric conversion film which converts only R light, an organic photoelectric conversion film which converts only G light, and an organic photoelectric conversion film which converts only B light are laminated in each pixel has been proposed (for example, refer to Japanese Unexamined Patent Application Publication No. 2007-104113). With this configuration, it is possible to generate full color image data without performing demosaic processing using one imaging element. For this reason, it is possible to make miniaturization of the imaging apparatus and a high quality of an image compatible.

SUMMARY

However, in the above described imaging element, there is a concern that a photoelectric conversion rate may be lowered. In the above described imaging element, three respective photoelectric conversion films transmit light out of a wavelength region of a target of a photoelectric conversion, however, the transmittivity is less than 100%. For this reason, every time of penetrating the photoelectric conversion film, a light intensity of transmitted light becomes small. For example, when transmittivity of one photoelectric conversion film is 80%, the light intensity of transmitted light is attenuated to approximately 0.5 ($\cong 0.8 \times 0.8 \times 0.8$) times by penetrating three photoelectric conversion films. Due to the attenuation of the light intensity, there is a problem in that the photoelectric conversion rate is lowered in the above described imaging element.

It is desirable to provide an imaging element with a high photoelectric conversion rate.

According to an embodiment of the present technology, there is provided an imaging element which includes a laminated plurality of photoelectric conversion units, and an input light reflecting unit which reflects light beams input from the plurality of photoelectric conversion units toward directions of the plurality of photoelectric conversion units. In this manner, light beams input from the plurality of photoelectric conversion units are reflected toward the directions of the plurality of photoelectric conversion units.

In the imaging element, the respective plurality of photoelectric conversion units may convert a part of light beams among light beams with different wavelength regions from each other into an electrical signal as target light, and may transmit light beams other than the target light. In this manner, a part of light beams among light beams with different wavelength regions from each other is converted into an electrical signal as a target light, and light beams other than the target light are transmitted.

In the imaging element, a reflecting unit between photoelectric conversion units which is arranged between two photoelectric conversion units which are neighboring among the plurality of photoelectric conversion units, reflects light in a wavelength region corresponding to a far photoelectric conversion unit which is further from the input light reflecting unit among the two photoelectric conversion units toward a direction of the far photoelectric conversion unit as reflected light, and transmits light other than the reflected light may be further included. In this manner, light in a wavelength region corresponding to a far photoelectric conversion unit is reflected toward a direction of the far photoelectric conversion unit, and light other than the reflected light is transmitted.

In the imaging element, the input light reflecting unit may reflect light in the wavelength region corresponding to the photoelectric conversion unit which is closest to the input light reflecting unit. In this manner, light in a wavelength region corresponding to the photoelectric conversion unit which is closest to an input light reflecting unit is reflected.

In the imaging element, the laminated plurality of photoelectric conversion units may be arranged in a plurality of pixels, respectively, and the plurality of photoelectric conversion units may output the electric signals which denote respective luminances of a plurality of colors as pixel signals in each of the pixels. In this manner, pixel signals which denote respective luminances of a plurality of colors are output.

In the imaging element, a pixel addition unit which adds up the pixel signals output from the pixels of a predetermined number, which are neighboring, may be further included. In this manner, pixel signals which are output from the pixels of a predetermined number, which are neighboring, are added up.

In the imaging element, an encoding unit which performs encoding of an image which is formed of the pixel signals may be further included. In this manner, an image formed of pixel signals is encoded.

In the imaging element, the input light reflecting unit may contain a material of which reflectivity is higher than a predetermined value. In this manner, reflectivity of the input light reflecting unit becomes higher than a predetermined value.

In the imaging element, the input light reflecting unit may contain guanine as the material. In this manner, light is reflected using the input light reflecting unit containing guanine.

In the imaging element, the input light reflecting unit may contain aluminum as the material. In this manner, light is reflected using the input light reflecting unit containing aluminum.

According to another embodiment of the present technology, there is provided an imaging apparatus which includes a laminated plurality of photoelectric conversion units; an input light reflecting unit which reflects light beams input from the plurality of photoelectric conversion units toward directions of the plurality of photoelectric conversion units; and a storage unit which stores an image formed of electric signals which are converted from light beams using the plurality of photoelectric conversion units. In this manner, light beams input from a plurality of photoelectric conversion units are reflected toward directions of the plurality of photoelectric conversion units.

According to the embodiments of the present technology, it is possible to exhibit a good effect of making sensitivity of an imaging element high. In addition, the effect described here is not necessarily limited, and may be any effect which is described in the disclosure.

BRIEF DESCRIPTION OF THE DRAWINGS

FIG. 7 is a table which illustrates examples of a regular reflective material and a diffusible material according to the first embodiment;

FIG. 8 is a table which illustrates an example of the diffusible material according to the first embodiment;

FIG. 18 is a block diagram which illustrates one configuration example of an imaging element according to the third embodiment; and FIG. 19 is an example of a cross-sectional view of a pixel array unit according to the third embodiment.

DETAILED DESCRIPTION OF EMBODIMENTS

Hereinafter, embodiments for embodying the present technology (hereinafter, referred to as embodiments) will be described. Descriptions will be made in the following order.

1. First Embodiment (example in which laminated plurality of photoelectric conversion films and reflecting film are provided in imaging element)

2. Second Embodiment (example in which laminated plurality of photoelectric conversion films are provided, and reflecting film is provided in imaging element in each photoelectric conversion film)

3. Third Embodiment (example in which laminated plurality of photoelectric conversion films, reflecting film, and encoding unit are provided in imaging element).

4. Modification Example

1. First Embodiment

Configuration Example of Imaging Apparatus

Figure 1:
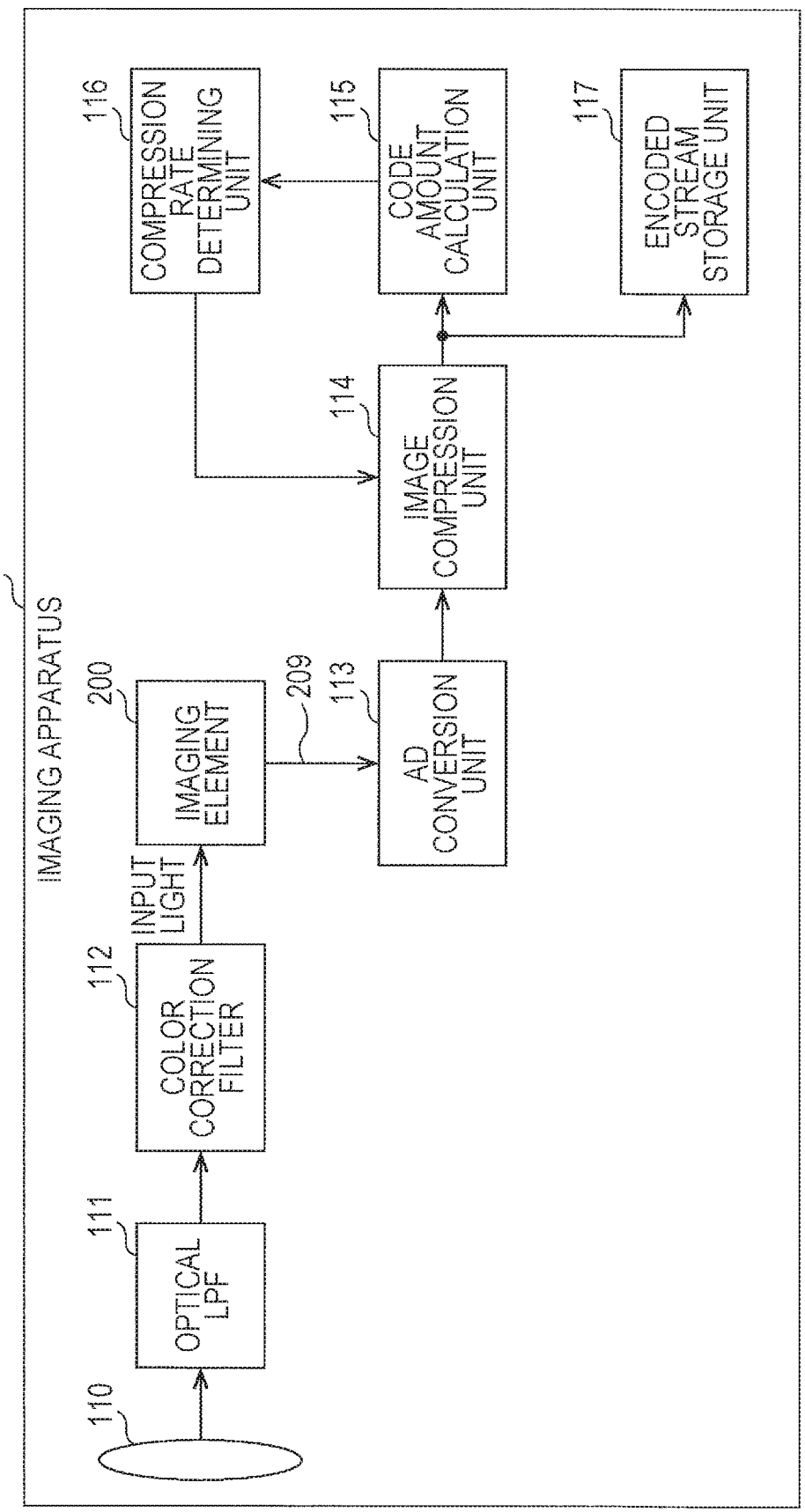
FIG. 1 is a block diagram which illustrates one configuration example of an imaging apparatus according to a first embodiment.

FIG. 1 is a block diagram which illustrates one configuration example of an imaging apparatus 100 according to a first embodiment. The imaging apparatus 100 includes an imaging lens 110, an optical LPF 111, a color correction filter 112, an imaging element 200, an AD conversion unit 113, an image compression unit 114, a code amount calculation unit 115, a compression rate determination unit 116, and an encoded stream storage unit 117.

The imaging lens 110 condenses input light in the imaging element 200 by varying zoom magnification and a diaphragm according to an operation by a user. The optical LPF 111 suppresses an occurrence of interference fringes which are referred to as moiré in the input light which passes through the imaging lens 110. The color correction filter 112 corrects a color temperature of input light by controlling a wavelength region through which the input light is passed in the input light which passes through the optical LPF 111.

The imaging element 200 converts the input light from the imaging lens 110 into an electric signal. The imaging element 200 includes a plurality of pixels, and supplies the electrical signal which is generated in each pixel to the AD conversion unit 113 as a pixel signal. The AD conversion unit 113 converts respective analog signals from the imaging element 200 into digital image data. The AD conversion unit 113 supplies the image data which is configured of a plurality of pixel data items to the image compression unit 114 through a signal line 209.

The image compression unit 114 compresses image data using a compression rate which is determined by the compression rate determination unit 116. The image compression unit 114 divides image data into k (k is an integer) blocks, and performs a compression in each block. The compression of respective blocks is performed using a discrete cosine transform, for example. The image compression unit 114 supplies the compressed data to the code amount calculation unit 115 and the encoded stream storage unit 117 every time a block is compressed. Since one image data item is divided into k image data items, k encoded data items are supplied for each image data item.

The code amount calculation unit 115 calculates a code amount per block. The code amount calculation unit 115 obtains a code amount per block from a plurality of encoded data items. For example, the code amount calculation unit 115 calculates a mean value of a data size of a predetermined number of encoded data items, or the like, as a code amount per block. The code amount calculation unit 115 supplies the calculated code amount to the compression rate determination unit 116.

The compression rate determination unit 116 determines a compression rate of image data. The compression rate determination unit 116 determines a compression rate based on the code amount per block so that the code amount per frame becomes a desired value. The compression rate determination unit 116 supplies the determined compression rate to the image compression unit 114.

The encoded stream storage unit 117 stores an encoded stream which is formed of encoded data. In addition, the encoded stream storage unit 117 is an example of the storage unit which is described in the disclosure.

Configuration Example of Imaging Element

Figure 2:
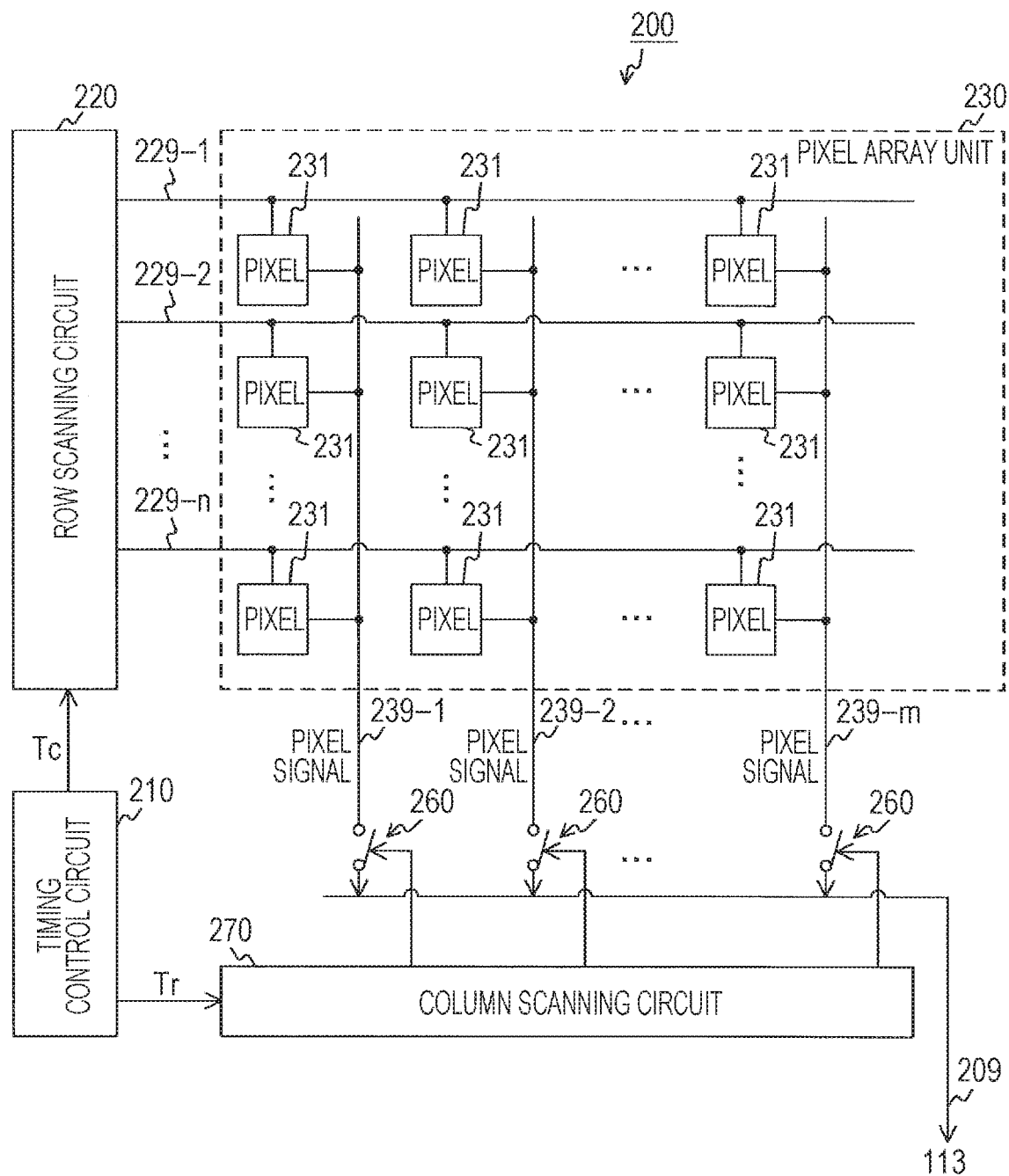
FIG. 2 is a block diagram which illustrates one configuration example of an imaging element according to the first embodiment.

FIG. 2 is a block diagram which illustrates one configuration example of the imaging element 200 according to the first embodiment. The imaging element 200 includes a timing control circuit 210, a row scanning circuit 220, a pixel array unit 230, a plurality of column selecting switches 260, and a column scanning circuit 270.

The timing control circuit 210 controls scanning timing in rows and columns. Here, in a row, a plurality of pixels are arranged in one direction in the pixel array unit 230, and in a column, a plurality of pixels are arranged in a direction orthogonal to a row in the pixel array unit 230. Hereinafter, a direction which is parallel to a row is referred to as the "horizontal direction", and a direction which is parallel to a column is referred to as the "vertical direction".

The timing control circuit 210 generates a timing signal Tc which instructs timing for scanning a row, and supplies the signal to the row scanning circuit 220 when starting an imaging period for imaging one image. In addition, the timing control circuit 210 generates a timing signal Tr which instructs timing for scanning a column, and supplies the signal to the column scanning circuit 270 in synchronization with timing of selecting a row in the imaging period.

The row scanning circuit 220 selects each row according to the timing signal Tc. The row scanning circuit 220 selects a row by sequentially outputting a row selecting signal to each row through signal lines 229-1 to 229-n (n is an integer) according to the timing signal Tc.

The pixel array unit 230 is a unit in which a plurality of pixels 231 are arranged in a two-dimensional lattice shape. In the pixel array unit 230, n rows and m (m is an integer) columns are arranged. The respective pixels 231 output a pixel signal with a potential corresponding to intensity of received light to the column selecting switch 260 through a signal line of a corresponding column among signal lines 239-1 to 239-m when the row selecting signal is input. Here, the pixel signal includes an R signal corresponding to intensity of received light of red, a G signal corresponding to intensity of received light of green, and a B signal corresponding to intensity of received light of blue.

The column selecting switch 260 opens or closes a track between the columns in the pixel array unit 230 and a signal line 209 according to the column selecting signal from the column scanning circuit 270. The column selecting switch 260 is provided in each column. The respective column selecting switches 260 include two terminals, and in which one terminal is connected to a signal line of a corresponding column among the signal lines 239-1 to 239-m, and the other terminal is connected to the signal line 209.

The column scanning circuit 270 selects each column according to the timing signal Tr. The column scanning circuit 270 selects columns by sequentially outputting a column selecting signal to each of the column selecting switches 260 according to the timing signal Tr.

Configuration Example of Pixel Array Unit

Figure 3:
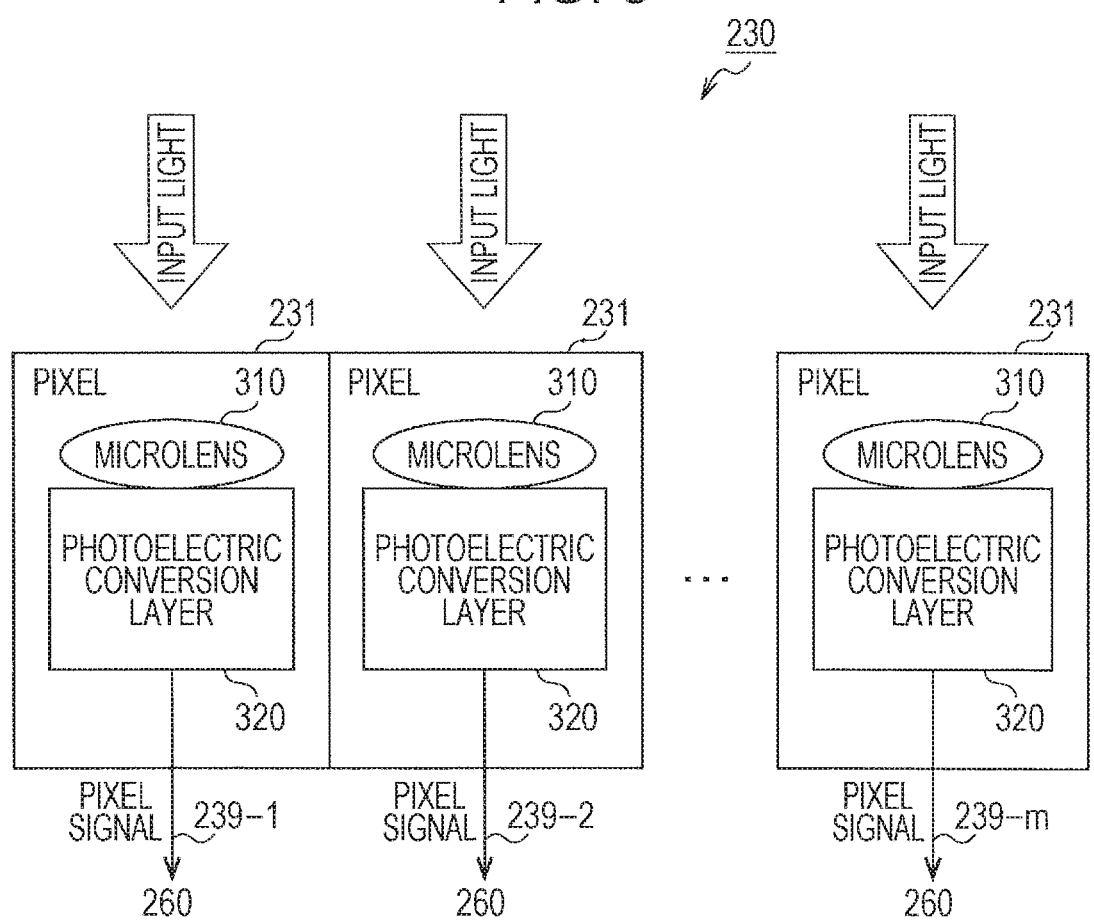
FIG. 3 is an example of a cross-sectional view of a pixel array unit according to the first embodiment taken along the horizontal direction or the vertical direction.

FIG. 3 is an example of a cross-sectional view of the pixel array unit 230 according to the first embodiment which goes along the horizontal direction or vertical direction. In the pixel array unit 230, light from the imaging lens 110 is input. The input direction of the light is the horizontal direction, or a direction perpendicular to the horizontal direction. In addition, the pixel array unit 230 has two planes which are perpendicular to an optical axis, and one thereof is used as a light receiving face which receives light. The respective pixels 231 include a microlens 310 and a photoelectric conversion layer 320. The microlens 310 is arranged on the light receiving face. In addition, the photoelectric conversion layer 320 is arranged under the microlens 310 by setting a direction toward the imaging lens 110 to an upward direction.

The microlens 310 condenses input light from the imaging lens 110, and supplies the input light to the photoelectric conversion layer 320. The photoelectric conversion layer 320 converts the input light which passes through the microlens 310 into an electric signal. The photoelectric conversion layer 320 supplies the converted electrical signal to the column selecting switch 260 through a corresponding signal line among the signal lines 239-1 to 239-m as a pixel signal.

Configuration Example of Photoelectric Conversion Layer

Figure 4:
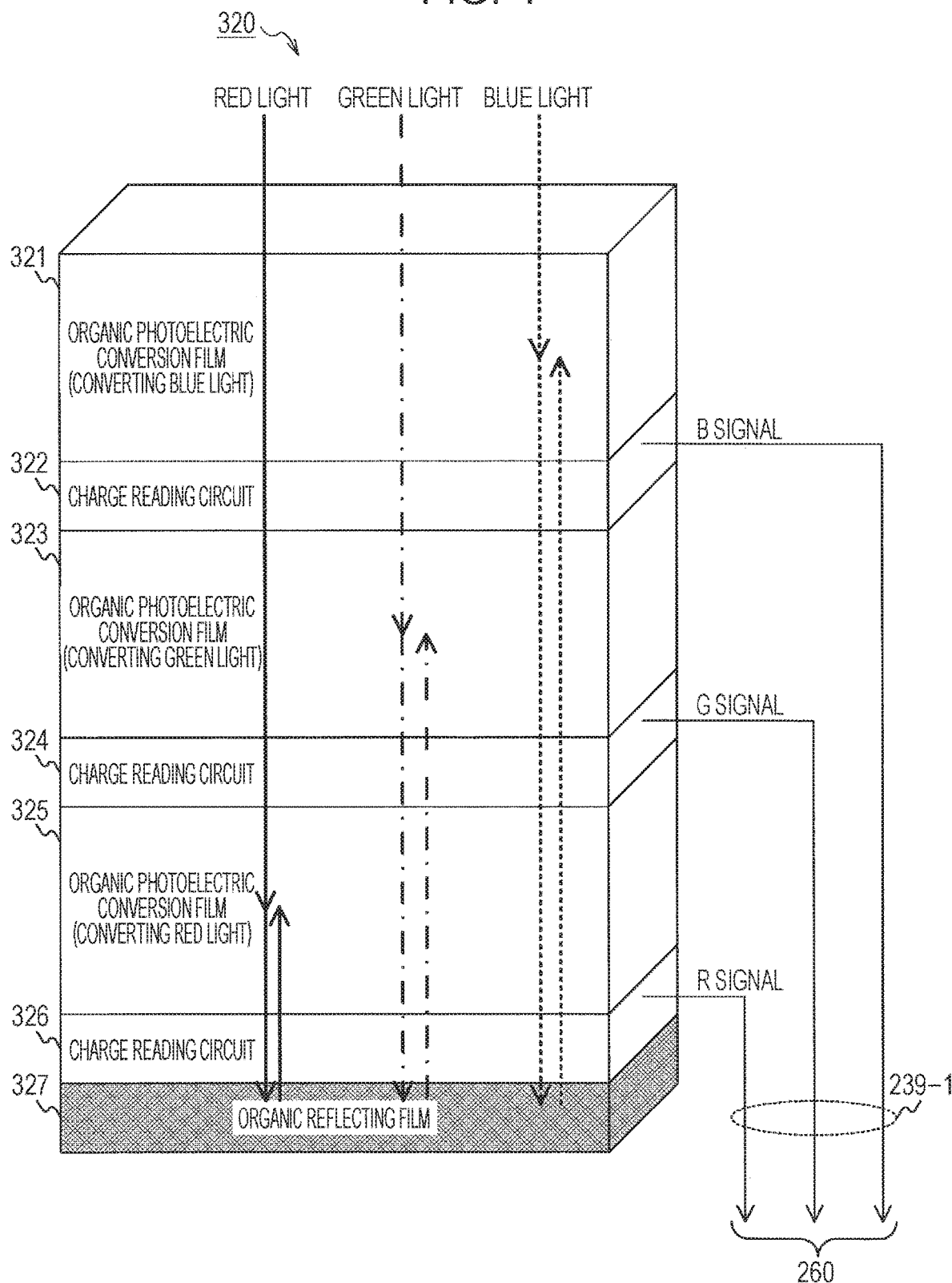
FIG. 4 is an example of a perspective view of a photoelectric conversion layer according to the first embodiment.

FIG. 4 is an example of a perspective view of the photoelectric conversion layer 320 according to the first embodiment. The photoelectric conversion layer 320 includes organic photoelectric conversion films 321, 323, and 325, charge reading circuits 322, 324, and 326, and an organic reflecting film 327. The organic reflecting film 327 is arranged on the lowermost layer, and the charge reading circuit 326 is laminated on the upper layer thereof. The organic photoelectric conversion film 325 is laminated on the upper layer of the charge reading circuit 326. In addition, the charge reading circuit 324 is laminated on the upper layer of the organic photoelectric conversion film 325, and the organic photoelectric conversion film 323 is laminated on the upper layer thereof. In addition, the charge reading circuit 322 is laminated on the upper layer of the organic photoelectric conversion film 323, and the organic photoelectric conversion film 321 is laminated on the upper layer thereof.

The organic photoelectric conversion films 321, 323, and 325 convert light beams of wavelength regions different from each other into charge, and transmit light beams other than those. The organic photoelectric conversion film 321 converts blue light with a wavelength region of blue into charge, and transmits light beams other than that. The organic photoelectric conversion film 323 converts green light with a wavelength region of green into charge, and transmits light beams other than that. The organic photoelectric conversion film 325 converts red light with a wavelength region of red into a charge, and transmits light beams other than that. However, a photoelectric conversion rate of the respective organic photoelectric conversion films 321, 323, and 325 is less than 100%, and the organic photoelectric conversion films are capable of performing the photoelectric conversion with respect to only a part of light beams among light beams in the corresponding wavelength regions. The remaining light not being subject to the photoelectric conversion by the organic photoelectric conversion films (321, or the like) is reflected using the organic reflecting film 327, and is input to the organic photoelectric conversion films (321, or the like) again.

These organic photoelectric conversion films 321, 323, and 325 are formed using an organic material. For example, an organic compound which is described in FIG. 52 in Japanese Unexamined Patent Application Publication No. 2012-4443 is used. As exemplified in Japanese Unexamined Patent Application Publication No. 2012-4443, the organic photoelectric conversion film 321 which converts blue light is formed using BCzVBi, or the like. In addition, the organic photoelectric conversion film 323 which converts green light is formed using quinacridone, or the like. The organic photoelectric conversion film 325 which converts red light is formed using ZnPc, or the like. In addition, when it is possible to obtain a photoelectric conversion film which converts light in a specific wavelength region into a charge, and transmits light other than that, an organic material other than these, or an inorganic material may be used.

In addition, the respective organic photoelectric conversion films 321, 323, and 325 are examples of a photoelectric conversion unit which is described in the disclosure.

In addition, the organic photoelectric conversion films are laminated in order of 321, 323, and 325 from the upper layer, however, the order of lamination is not limited to this.

The charge reading circuits 322, 324, and 326 read charges which are subjected to a photoelectric conversion, and supply electric signals with voltages corresponding to an amount of charge thereof. In addition, the charge reading circuits 322, 324, and 326 transmit light in the whole wavelength region.

The charge reading circuit 322 includes a floating diffusion layer and a plurality of transistors, for example. The charge reading circuit 322 reads a charge from the organic photoelectric conversion film 321 according to a row selecting signal, and accumulates the charge on the floating diffusion layer. In addition, the charge reading circuit 322 supplies an electrical signal with a voltage corresponding to the accumulated charge amount to the column selecting switch 260 as a B signal. Configurations of the charge reading circuits 324 and 326 are the same as that of the charge reading circuit 322. The charge reading circuit 324 supplies a G signal by reading a charge from the organic photoelectric conversion film 323, and the charge reading circuit 326 supplies an R signal by reading a charge from the organic photoelectric conversion film 325. Signals including these R, G, and B signals are output as pixel signals from the respective pixels 231.

The organic reflecting film 327 reflects light beams which are input by penetrating the organic photoelectric conversion films 321, 323, and 325, and charge reading circuits 322, 324, and 326 toward directions of the organic photoelectric conversion films 321, 323, and 325.

In addition, the organic reflecting film 327 is an example of the input light reflecting unit which is described in the disclosure.

When the organic reflecting film 327 reflects light toward the organic photoelectric conversion films 321, 323, and 325, the respective organic photoelectric conversion films 321, 323, and 325 can perform a photoelectric conversion with respect to both input light from the upper side and reflected light from the lower side. In this manner, it is possible to improve a photoelectric conversion rate of the imaging element 200 compared to a configuration in which the organic reflecting film 327 is not provided. In this manner, a sensitivity of the imaging element 200 increases. Here, in order to increase the sensitivity of the imaging element 200, there is a method of electrically amplifying a pixel signal after the photoelectric conversion, in addition to the method of increasing the photoelectric conversion rate. However, when a pixel signal is amplified, an image quality deteriorates due to an increase in noise in the pixel signal, in general. It is possible to increase the sensitivity of the imaging element 200 without amplifying the pixel signal by increasing a photoelectric conversion rate, by providing the organic reflecting film 327. For this reason, it is possible to make the high image quality and the high sensitivity compatible.

In addition, the organic reflecting film 327 can be generated using a technology of biomimetics. Biomimetics is a technology in which a chemically composed substance is generated by imitating a natural production method, or a structure and movement mechanism of a creature is imitated, and is applied to manufacture. As a practical application example, there is a swimsuit for high-speed racing which is made in imitation of the skin of a shark, a shape of a head car of the Shinkansen of which a hint is got from a mouth of a kingfisher, or the like, and it is said that there is no limit for the example.

Here, it is said that an animal which captures prey at night such as a cat or lion has excellent eyesight even in a place which is dark and not visible to a human being. In addition, alfonsinos live near the bottom of the sea at 300 M to 500 M of a deep sea, prey on bait, and live even in a place where light hardly reaches. This is why these creatures have a structure or a function of an eyeball with an excellent night vision ability.

The reason why these creatures have eyesight like a night vision camera is that there is a tissue referred to as a "tapetum" under a retina of the eyes of the creatures.

Figure 5:
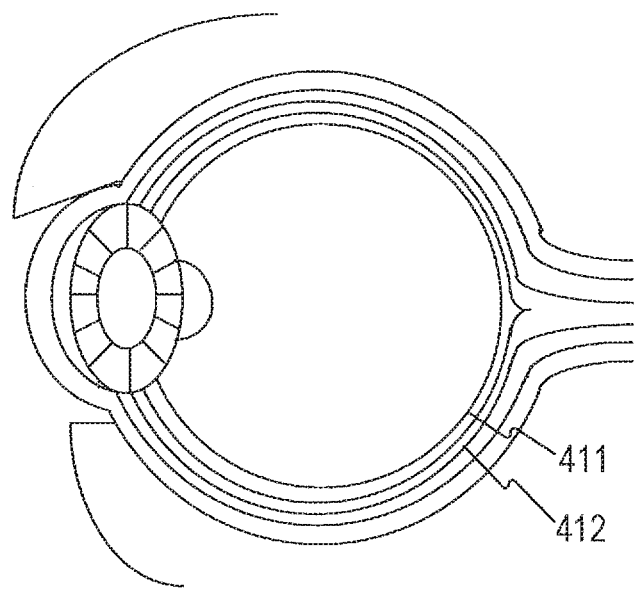
FIG. 5 is a diagram which describes a tapetum according to the first embodiment.

FIG. 5 is a diagram which describes the tapetum according to the first embodiment. FIG. 5 illustrates an example of a cross-sectional view of an eyeball of a cat. As illustrated in FIG. 5, the eyeball of a cat includes a retina 411 and a tapetum 412.

The retina 411 corresponds to a film in a camera, light which is input from a pupil focuses on the retina, and an image is projected. The tapetum 412 is arranged on the lower layer of the retina 411 by setting a direction toward the pupil to the upper side. The tapetum 412 reflects light which passes through the retina 411 once, by taking a role of a reflecting plate, and sends the light back to the retina 411 once again. Since it is possible to use the light twice using the tapetum 412 even if the light is weak, a cat can have good eyesight even in a dark place. The reason why the eyes of a cat flash in darkness is that input light is reflected on the tapetum 412. The tapetum 412 has guanine as a main ingredient.

In addition, the alfonsino which is a deep-sea fish also has a tapetum configured of a guanine crystal, or the like, in a pigment etothelial cell, or on a membranous connection layer on the rear portion of the retina, in order to increase use efficiency of light. This is why the eyes of the alfonsino appear gold in color. A common fish (teleostei) has a tapetum in a pigment etothelial cell, however, a shark, a ray, or the like, has a tapetum on the membranous connection layer, and reflects light in the same direction as that of input light in any portion in the eyeball.

Figure 6:
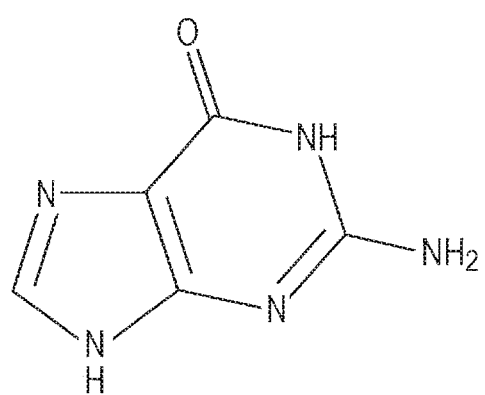
FIG. 6 is a diagram which illustrates a molecular formula of guanine according to the first embodiment.

FIG. 6 is a diagram which illustrates a molecular formula of guanine according to the first embodiment. As illustrated in FIG. 6, guanine contained in a tapetum has a molecular formula of $C_5H_5N_5O$, and has a purine base which is one of five main bases which constitute a nucleic acid. In addition, a molecular weight of guanine is 151.13. A nucleoside which is derived from guanine is guanosine. For organic compounds and inorganic compounds, an IUPAC name is provided according to the International Union of Pure and Applied Chemistry (IUPAC) method. The IUPAC name of guanine is "2-amino-1,9-dihydro-6H-purin-6-one". In addition, it is possible to obtain a 1,7-dihydro-form, a 3,7-dihydro-form, and a 3,9-dihydro-form through tautomerism.

In addition, guanine creates a base pair in a double strand structure of DeoxyriboNucleic Acid (DNA), or RiboNucleic Acid (RNA) through three hydrogen bonds with cytosine. Guanine is also a main ingredient which constitutes a silver-white portion of fish such as Salmonidae, hairtails, and the saury.

As described above, since guanine is a main ingredient of a tissue which reflects light, it is possible to realize the organic reflecting film 327 with high reflectivity, using guanine as an organic material of the organic reflecting film 327.

In addition, the imaging element 200 uses the organic reflecting film 327 containing an organic material as a reflecting film, however, an inorganic reflecting film containing an inorganic material as the reflecting film may be used instead of the organic reflecting film 327.

FIGS. 7 and 8 are tables which illustrate examples of materials with high reflectivity according to the first embodiment. It is possible to create a reflecting film using various inorganic materials exemplified in FIGS. 7 and 8. It is preferable that reflectivity be 90% or more, for example. In particular, as illustrated in FIG. 7, the reflectivity of aluminum is 90% to 95% which is relatively high, and in addition, aluminum has a property making a thin film being easy. Accordingly, aluminum is preferable as a material of the reflecting film, in addition to guanine.

Figure 9:
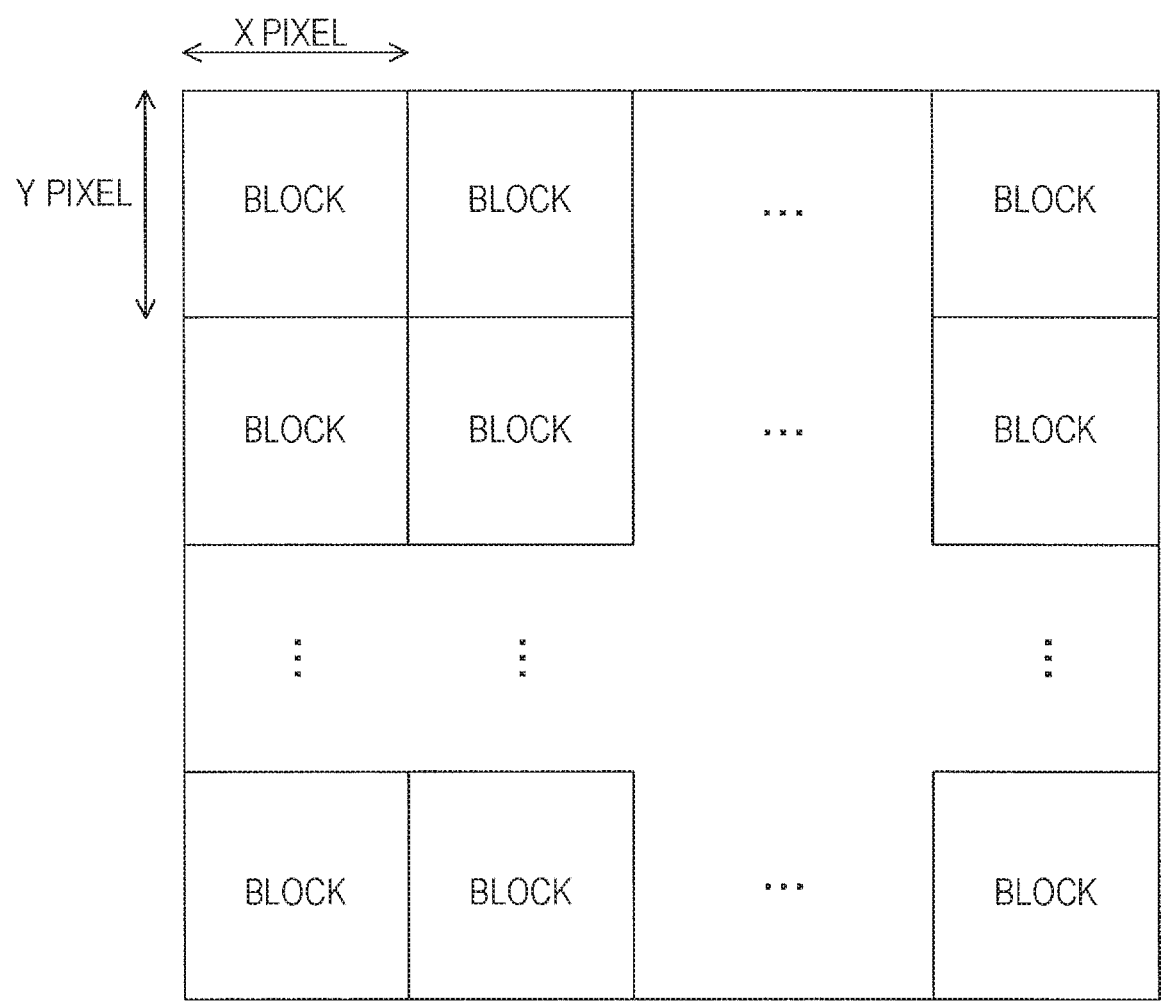
FIG. 9 is a diagram which illustrates an example of a unit of compression of an image according to the first embodiment.

FIG. 9 is a diagram which illustrates an example of a compression unit of an image according to the first embodiment. As illustrated in FIG. 9, an image from the AD conversion unit 113 is divided into a plurality of blocks with a predetermined shape. The shape of the block is, for example, a square of 8×8 pixels.

These blocks are compressed (encoded) in order by the image compression unit 114. As an encoding technology of a block unit, Joint Photographic Experts Group (JPEG), Moving Picture Experts Group (MPEG), or the like, is used. These are international standards which come into wide use in a digital camera, a camcorder, a smart phone, or the like. In JPEG and MPEG, compression is performed using a discrete cosine transform. In addition, it is possible for the image compression unit 114 to also perform tile-based encoding using JPEG 2000 which is a still image international standard by assuming that the rectangular block is a tile.

In addition, as described above, the sensitivity of the imaging element 200 is improved by providing the organic reflecting film 327. In this manner, a dynamic range which is a ratio of a minimum value to a maximum value of light intensity which can be detected by the imaging element 200 becomes wide compared to a case in which the organic reflecting film 327 is not provided. For this reason, it is preferable for the image compression unit 114 to perform compression using a compression method corresponding to a wide dynamic range such as JPEG 2000.

In this manner, according to the first embodiment of the present technology, since the imaging element 200 includes the laminated plurality of organic photoelectric conversion films, and the organic reflecting film 327 which reflects light input from those photoelectric conversion films, it is possible for the organic photoelectric conversion film to perform photoelectric conversion with respect to the reflected light, as well. In this manner, it is possible to increase a photoelectric conversion rate of the imaging element 200 compared to a case in which the organic reflecting film 327 is not provided.

FIRST MODIFICATION EXAMPLE

Image data is compressed in block units using a discrete cosine transform in the imaging apparatus 100 according to the first embodiment, however, when image data is compressed in block units, there is a concern that block noise may occur in an image. In order to prevent block noise, the imaging apparatus 100 also can compress image data in line units (rows or columns), rather than the block units. A first modification example is different from the first embodiment in a point that image data is compressed in line units.

An image compression unit 114 in the first modification example performs encoding image data in line units using a wavelet transform, for example. Here, the wavelet transform is a method in which image data is divided into four components, and is encoded using a filter bank including a low pass filter and a high pass filter. Here, the low pass filter is a filter which causes a frequency band lower than a cutoff frequency to pass therethrough, and the high pass filter is a filter which causes a frequency band higher than the cutoff frequency to pass therethrough.

Figure 10A:
FIGS. 10A and 10B are diagrams which illustrate examples of dividing of components according to a first modification example.
Figure 10B:
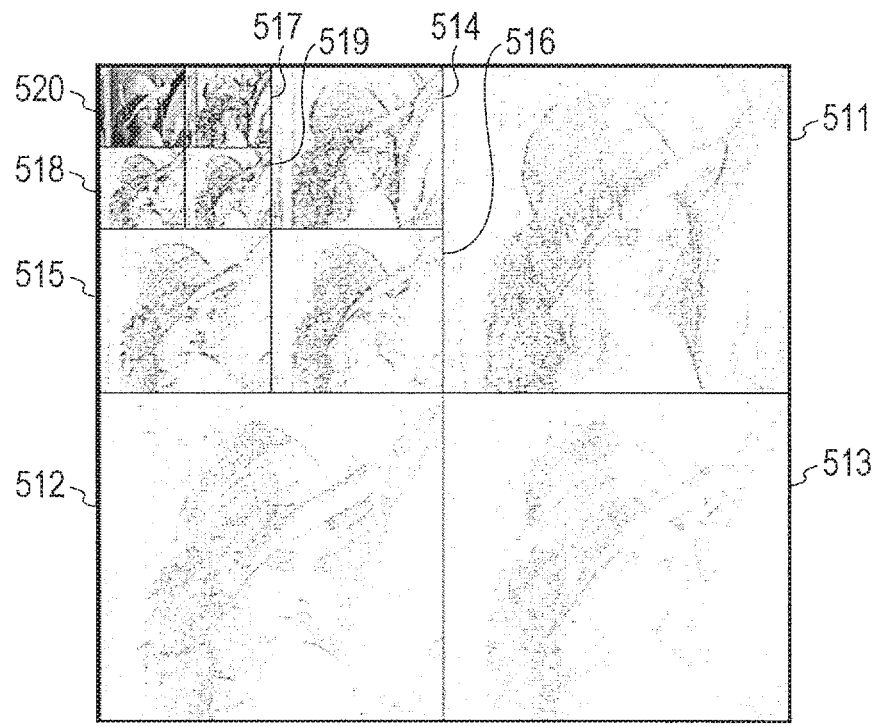

FIGS. 10A and 10B are diagrams which illustrate examples of division components in the first modification example. FIG. 10A is a diagram which illustrates an example of four sub-bands which are generated in one division. As illustrated in FIG. 10A, four sub-bands of an LL component 501, an HL component 502, an LH component 503, and an HH component 504 are generated from one image data item. Here, the LL component 501 is a component which is generated by being passed through the low pass filter twice. The HL component 502 is a component which is generated by being passed through the low pass filter after being passed through the high pass filter. The LH component 503 is a component which is generated by being passed through the high pass filter after being passed through the low pass filter. The HH component 504 is a component which is generated by being passed through the high pass filter twice.

FIG. 10B is a diagram which illustrates an example of sub-bands which are generated by dividing three times. As illustrated in FIG. 10B, due to first dividing, an LL component (not shown), an HL component 511, an LH component 512, and an HH component 513 are generated. By dividing the LL component which is firstly generated (that is, second dividing), an LL component (not shown), an HL component 514, an LH component 515, and an HH component 516 are generated. By dividing the LL component which is secondly generated (that is, third dividing), an LL component 520, an HL component 517, an LH component 518, and an HH component 519 are generated. In addition, the number of divisions of image data is not limited to one time or three times.

Figure 11:
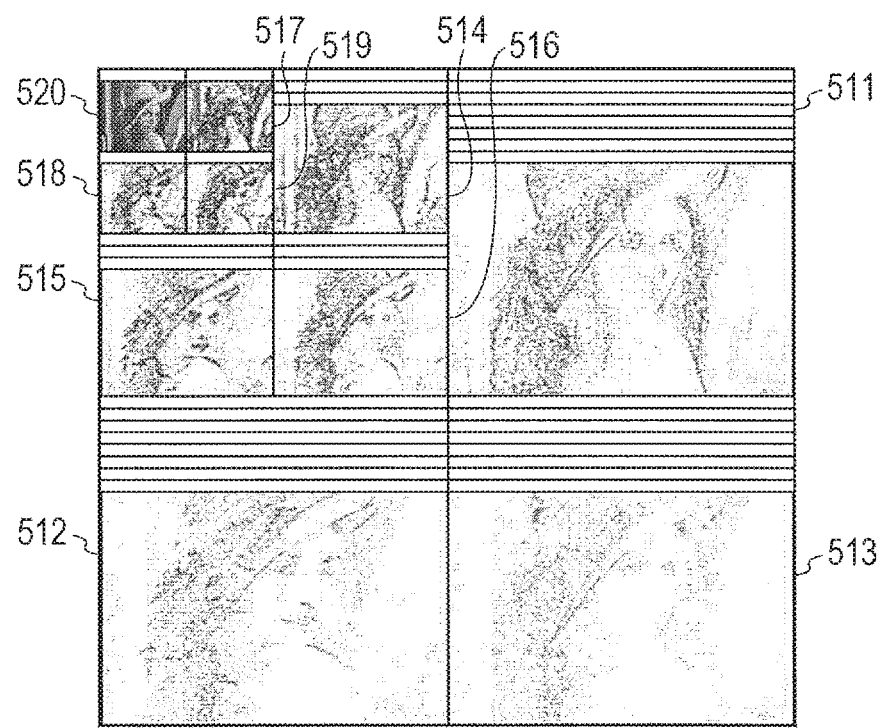
FIG. 11 is a diagram which illustrates an example of a unit of compression according to the first modification example.

FIG. 11 is a diagram which illustrates an example of a compression unit in the first modification example. In FIG. 11, an outlined rectangle denotes coefficient data which is maintained in a line buffer. Whenever the coefficient data is maintained in the line buffer, the image compression unit 114 performs a wavelet transform with respect to the coefficient data.

Figure 12:
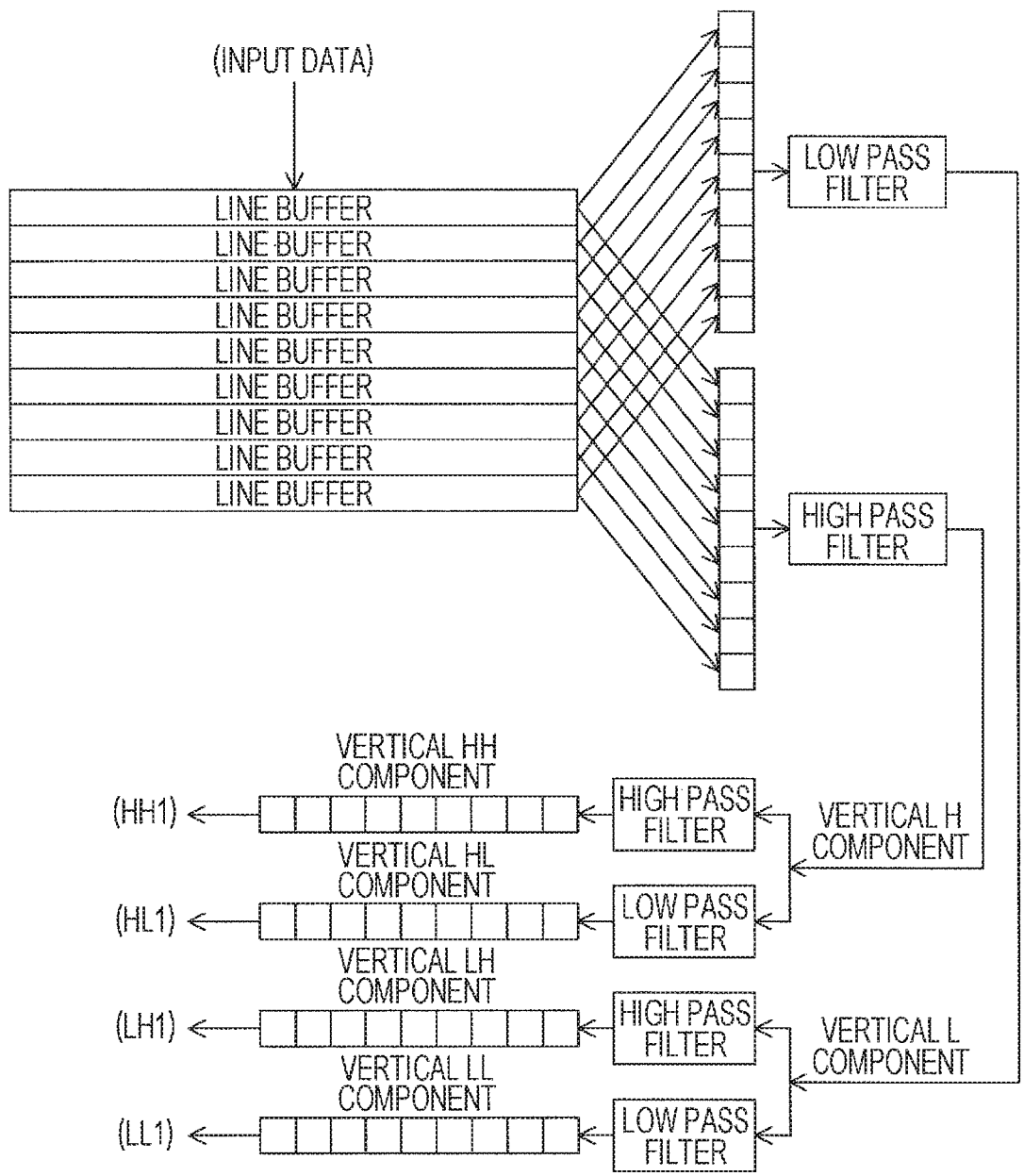
FIG. 12 is a diagram which describes a division method of an image according to the first modification example.

FIG. 12 is a diagram which describes a dividing method of an image in the first modification example. The image compression unit 114 includes line buffers and filter banks. The image compression unit 114 causes horizontal lines in the image data to be maintained in a predetermined number of (for example, 9) line buffers in order. In the nine horizontal lines in the line buffers, the image compression unit 114 generates a vertical L component by reading nine pixels with the same horizontal coordinate in order, and causing the nine pixels to pass through a low pass filter. In addition, the image compression unit 114 generates a vertical H component by causing the nine pixels to pass through a high pass filter. In addition, the image compression unit 114 generates a vertical HH component by causing the vertical H component to pass through the high pass filter, and generates a vertical HL component by causing the vertical H component to pass through the low pass filter. In addition, the image compression unit 114 generates a vertical LH component by causing the vertical L component to pass through the high pass filter, and generates the vertical LL component by causing the vertical L component to pass through the low pass filter. In this manner, the image compression unit 114 generates four sub-bands by performing filter processing in each line with respect to the image data.

Figure 13:
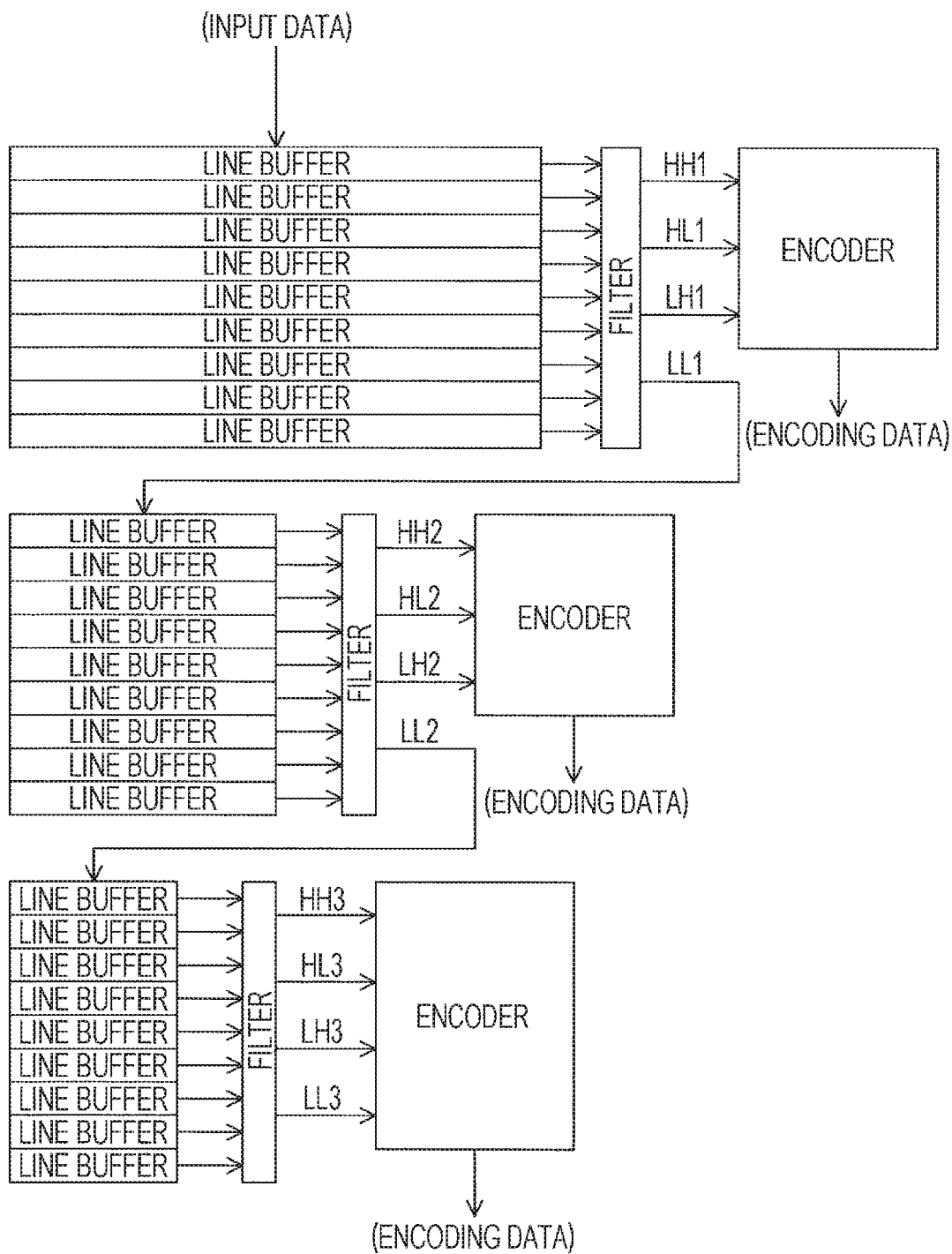
FIG. 13 is a diagram which describes a compression method of an image according to the first modification example.

FIG. 13 is a diagram which describes a compression method of an image in the first modification example. The image compression unit 114 divides image data into four sub-bands of HH1, HL1, LH1, and LL1 using the dividing method exemplified in FIG. 12. The image compression unit 114 generates encoded data by inputting the components of HH1, HL1, and LH1 among the four sub-bands to the encoder.

Subsequently, the image compression unit 114 divides LL1 into four sub-bands of HH2, HL2, LH2, and LL2 using line buffers of which sizes are a half of the line buffers which are used in the first dividing. The image compression unit 114 generates encoded data by inputting components of HH2, HL2, and LH2 among the four sub-bands to the encoder.

In addition, the image compression unit 114 divides LL2 into four sub-bands of HH3, HL3, LH3, and LL3 using line buffers of which sizes are a half of the line buffers which are used in the second dividing. The image compression unit 114 generates encoded data by inputting the components to the encoder.

In this manner, according to the first modification example, the imaging apparatus 100 can suppress an occurrence of block noise since image data is encoded in line units.

SECOND MODIFICATION EXAMPLE

The photoelectric conversion rate is increased in the first embodiment by providing the organic reflecting film 327, however, it is possible to further increase the photoelectric conversion rate using pixel addition in which a plurality of pixel signals are added. An imaging element in a second modification example is different from that in the first embodiment in a point that pixel addition is performed.

Configuration Example of Imaging Element

Figure 14:
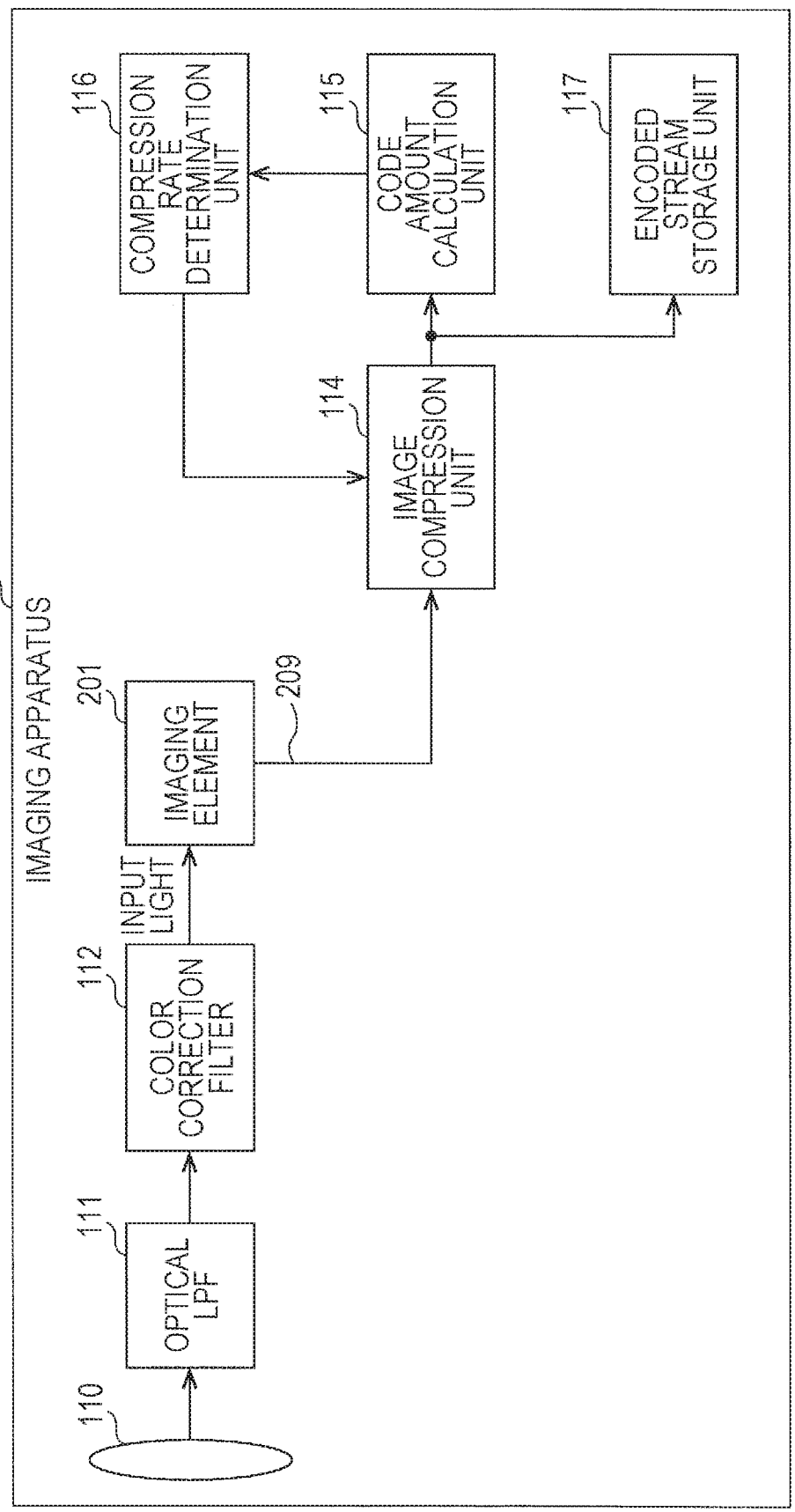
FIG. 14 is a block diagram which illustrates one configuration example of an imaging apparatus according to a second modification example.

FIG. 14 is a block diagram which illustrates one configuration example of an imaging apparatus 100 in the second modification example. The imaging apparatus 100 in the second modification example is different from that in the first embodiment in a point that an imaging element 201 is included instead of the imaging element 200 and the AD conversion unit 113. The imaging element 201 generates an analog pixel signal in each pixel, converts the pixel signal into digital pixel data, and supplies the digital pixel data to the image compression unit 114.

Figure 15:
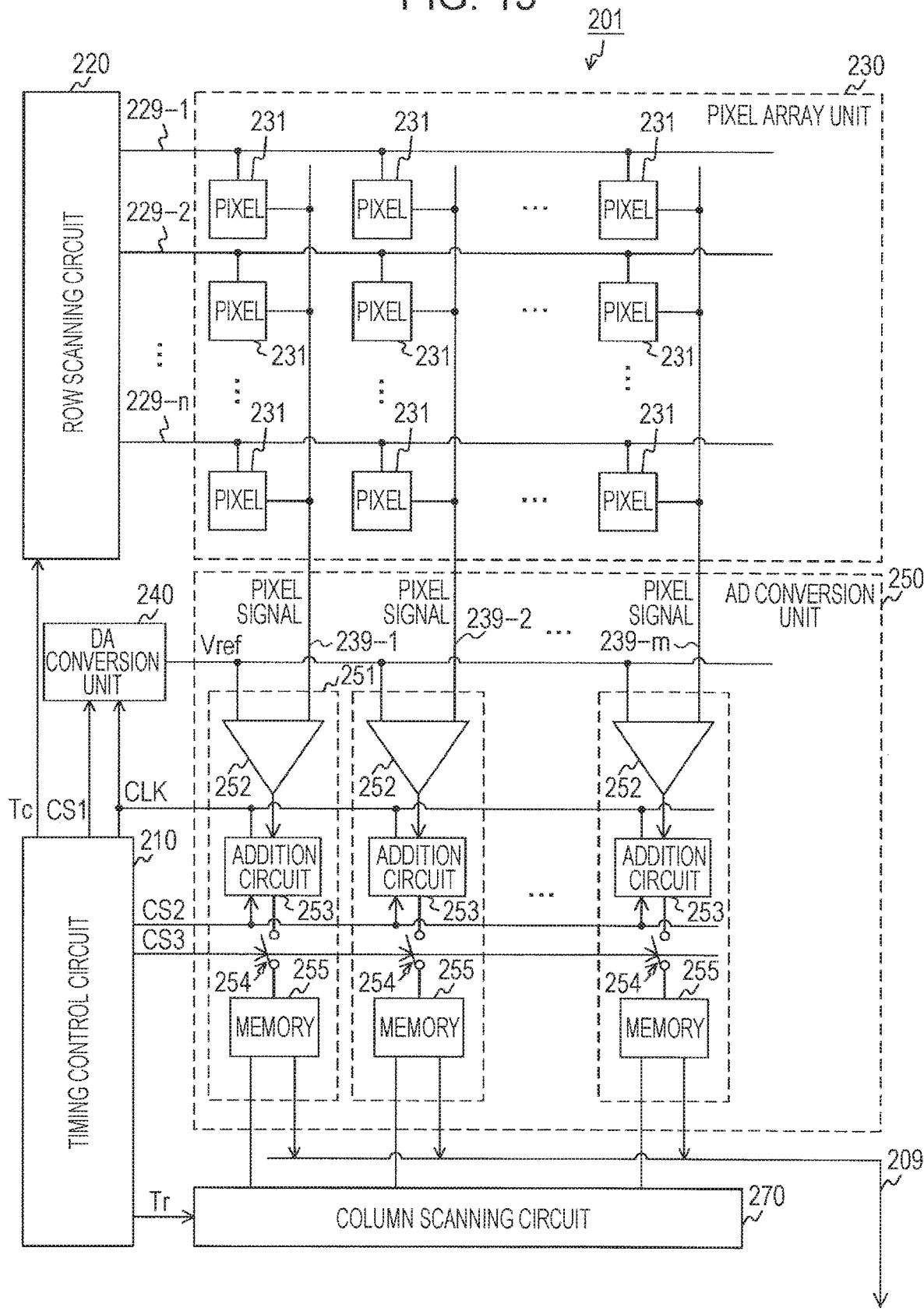
FIG. 15 is a block diagram which illustrates one configuration example of an imaging element according to the second modification example.

FIG. 15 is a block diagram which illustrates one configuration example of the imaging element 201 in the second modification example. The imaging element 201 is different from that in the first embodiment in a point that a DA conversion unit 240 and an AD conversion unit 250 are further included instead of the column selecting switch 260. The AD conversion unit 250 includes an AD converter 251 in each column. The respective AD converters 251 include a comparator 252, an addition circuit 253, a transfer switch 254, and a memory 255.

The DA conversion unit 240 generates a reference voltage Vref with a ramp waveform based on a clock signal CLK according to a control signal CS1 from a timing control circuit 210, and supplies the reference voltage to the respective comparators 252.

The timing control circuit 210 in the second modification example further generates a control signal CS1 which controls the DA conversion unit 240, a control signal CS2 which controls the addition circuit 253, a control signal CS3 which controls the transfer switch 254, and the clock signal CLK. The timing control circuit 210 supplies the control signal CS1 to the DA conversion unit 240, and supplies the clock signal CLK to the DA conversion unit 240 and the addition circuit 253, respectively. In addition, the timing control circuit 210 supplies the control signal CS2 to the addition circuits 253, respectively, and supplies the control signal CS3 to the transfer switches 254, respectively.

The comparator 252 compares a voltage of a pixel signal from a corresponding column to the reference voltage Vref. The comparator 252 supplies a comparison result thereof to the addition circuit 253.

The addition circuit 253 adds up pixel data of a plurality of rows which are neighboring according to the control signal CS2. The addition circuit 253 is realized using a counter, for example. The control signal CS2 includes a signal which resets a counter value of the counter, and a signal which increases or decreases a digital value. The timing control circuit 210 resets a counter value using the control signal CS2 at a scanning timing of an odd number line, for example, and increases or decreases the counter value based on a comparison result until reading in an even number line ends. In this manner, vertical pixel addition in which neighboring two pixels are added up in the vertical direction is executed. The addition circuit 253 supplies the added pixel data to the transfer switch 254.

In addition, the addition circuit 253 adds up two pixels, however, the addition circuit may add up three pixels or more. In addition, the imaging element 201 may add up pixels in the horizontal direction, not in the vertical direction. When performing the horizontal pixel addition, the addition circuit 253 is provided outside the AD conversion unit 250, and adds up pixel data which is read from the memory 255. In addition, the addition circuit 253 is an example of the pixel addition unit which is described in the disclosure.

The transfer switch 254 transfers pixel data to the memory 255 according to the control signal CS3. The transfer switch 254 includes two terminals, one terminal thereof is connected to the addition circuit 253, and the other terminal is connected to the memory 255. In addition, the control signal CS3 includes a signal instructing opening or closing of the transfer switch 254. The timing control circuit 210 controls the transfer switch 254 such that it is in a closed state when a counting operation of the addition circuit 253 ends, and controls the transfer switch such that it is in an open state when the counting operation of the addition circuit does not end.

The memory 255 maintains pixel data. A column scanning circuit 270 in the second modification example selects the memory 255 in order using a column scanning signal, and outputs the maintained pixel data in order.

In addition, the imaging element 201 adds up digital pixel data, however, the imaging element may add up analog pixel data before being subjected to an analog to digital (A/D) conversion. As a method of adding up analog pixel signal, there is an FD addition in which a floating diffusion layer is shared by a plurality of pixels, and charges which are subjected to a photoelectric conversion in each pixel are added up in the floating diffusion layer, as described in Japanese Unexamined Patent Application Publication No. 2010-183040. In addition, a source follower addition is known, in addition to the FD addition. In the source follower addition, as described in Japanese Patent No. 5251412, Metal-Oxide-Semiconductor (MOS) circuits as loads are provided in signal lines 239-1 to 239-*m* from the pixel array unit 230. In addition, the MOS circuit as the load adds up analog pixel signals.

In this manner, according to the second modification example, since the imaging element 201 adds up pixel signals of a plurality of pixels which are neighboring, it is possible to further improve the photoelectric conversion rate of the imaging element 201.

2. Second Embodiment
Configuration Example of Photoelectric Conversion Layer

In the first embodiment, the organic reflecting film 327 is provided on the lowermost layer of the photoelectric conversion layer 320, however, a reflecting film may be further provided between the organic photoelectric conversion films 321 and 323, and between the organic photoelectric conversion films 323 and 325. An imaging element 200 according to a second embodiment is different from that in the first embodiment in a point that the reflecting film is further provided between organic photoelectric conversion films.

Figure 16:
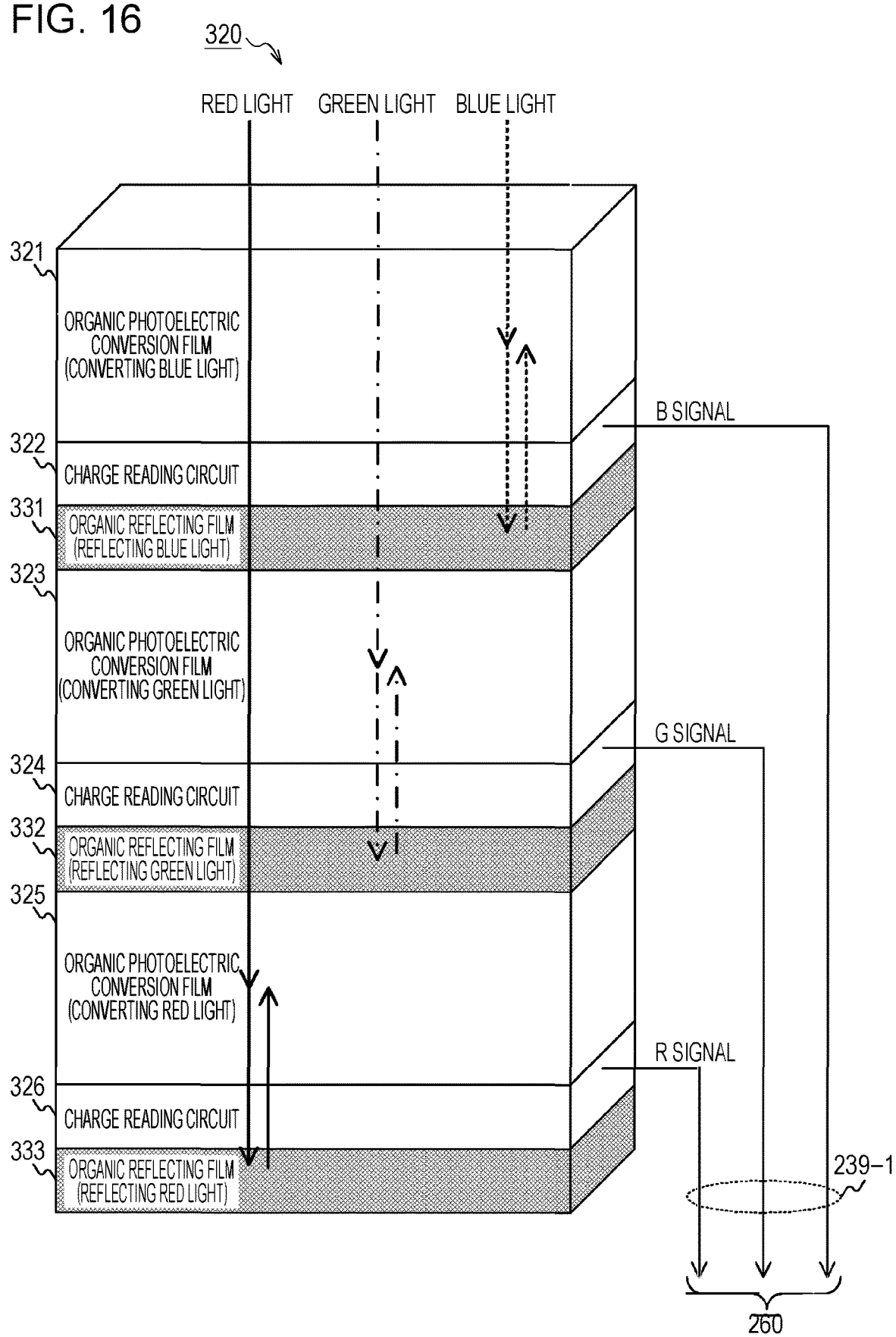
FIG. 16 is an example of a perspective view of a photoelectric conversion layer according to a second embodiment.

FIG. 16 is an example of a perspective view of a photoelectric conversion layer 320 according to the second embodiment. The photoelectric conversion layer 320 in the second embodiment is different from that in the first embodiment in a point that organic reflecting films 331, 332, and 333 are included instead of the organic reflecting film 327.

The organic reflecting films 331, 332, and 333 reflect light in a wavelength region corresponding to the closest organic photoelectric conversion film among organic photoelectric conversion films on the upper layer thereof, and transmit light other than that. The organic reflecting film 331 is arranged between the charge reading circuit 322 and the organic photoelectric conversion film 323, reflects blue light corresponding to the organic photoelectric conversion film 321 on the upper layer thereof toward a direction of the organic photoelectric conversion film 321, and transmits light other than that.

In addition, the organic reflecting film 332 is arranged between the charge reading circuit 324 and the organic photoelectric conversion film 325, reflects green light corresponding to the closest organic photoelectric conversion film 323 among organic photoelectric conversion films on the upper layer thereof toward a direction of the organic photoelectric conversion film 323, and transmits light other than that. In addition, the organic reflecting film 333 is arranged on the lowermost layer, reflects red light corresponding to the closest organic photoelectric conversion film 325 among organic photoelectric conversion films on the upper layer thereof toward a direction of the organic photoelectric conversion film 321, and transmits light other than that.

The blue light which is not subjected to photoelectric conversion in the organic photoelectric conversion film 321 is reflected toward a direction of the organic photoelectric conversion film 321 by the organic reflecting film 331 on the lower layer thereof. For this reason, the organic photoelectric conversion film 321 can perform photoelectric conversion with respect to both input light from the upper side and reflected light from the lower side.

Here, according to the first embodiment, the blue light which passes through the organic photoelectric conversion film 321 passes through the respective organic photoelectric conversion films 323 and 325 twice, and reaches the organic photoelectric conversion film 321 again, however, according to the second embodiment, the blue light does not pass through these layers. In addition, according to the first embodiment, the blue light passes through the respective charge reading circuits 322, 324, and 326 twice, and reaches the organic photoelectric conversion film 321 again, however, according to the second embodiment, the blue light passes through only the charge reading circuit 322 twice. In this manner, according to the second embodiment, since the blue light passes through a small number of layers, an amount of attenuation in a light intensity which is caused when passing through the layers becomes small. Accordingly, the light intensity of reflected light of the blue light becomes large compared to that in the first embodiment. A light intensity of reflected light of the green light becomes large for the same reason.

In addition, the organic reflecting films 331 and 333 are examples of the reflecting film between photoelectric conversion units which is described in the disclosure. In addition, the reflecting film is provided between the organic photoelectric conversion films 321 and 323, and between the organic photoelectric conversion films 323 and 325, however, the reflecting film may be provided in any one of these.

In addition, the organic reflecting film 333 on the lowermost layer is configured so as to reflect only light in a specific wavelength region, however, the film may be configured so as to reflect light in the whole wavelength region.

In this manner, according to the second embodiment, since a reflecting film which reflects light in a wavelength region corresponding to an organic photoelectric conversion film on the upper layer among those is provided between two neighboring organic photoelectric conversion films, it is possible for the organic photoelectric conversion film to perform photoelectric conversion with respect to reflected light, as well. In this manner, an amount of attenuation of the reflected light becomes small, and the photoelectric conversion rate is further improved.

3. Third Embodiment
Configuration Example of Imaging Apparatus

According to the first embodiment, the imaging apparatus 100 is provided with a circuit which performs encoding of an image, specifically, the AD conversion unit 113, the image compression unit 114, the code amount calculation unit 115, and the compression rate determination unit 116 outside the imaging element 200. However, these circuits may be provided inside the imaging element 200. An imaging apparatus 100 according to a third embodiment is different from that in the first embodiment in a point that a circuit which performs encoding of an image is further provided in the imaging element.

Figure 17:
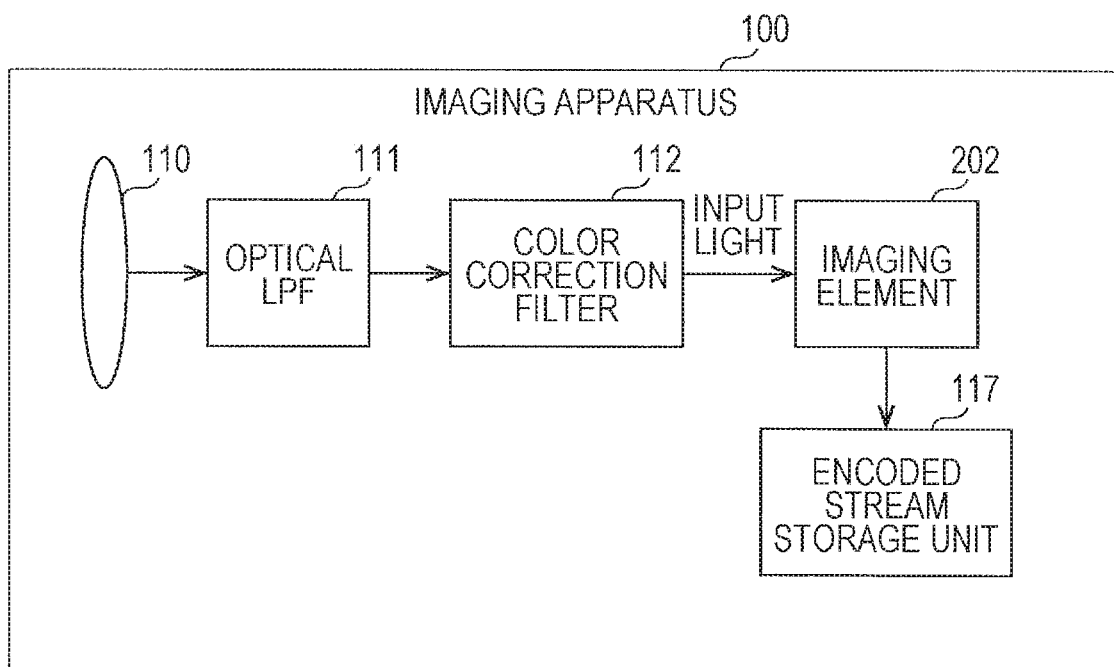
FIG. 17 is a block diagram which illustrates one configuration example of an imaging apparatus according to a third embodiment.

FIG. 17 is a block diagram which illustrates one configuration example of the imaging apparatus 100 according to the third embodiment. The imaging apparatus 100 in the third embodiment is different from that in the first embodiment in a point that an imaging element 202 is provided instead of the imaging element 200, the AD conversion unit 113, the image compression unit 114, the code amount calculation unit 115, and the compression rate determination unit 116.

The imaging element 202 generates a pixel signal in each pixel, generates encoded data by encoding an image which is formed of the pixel signals, and supplies the data to the encoded stream storage unit 117.

Configuration Example of Imaging Element

FIG. 18 is a block diagram which illustrates one configuration example of the imaging element 202 according to the third embodiment. The imaging element 202 is different from that in the first embodiment in a point that the column selecting switch 260 and the column scanning circuit 270 are not provided. In addition, in FIG. 18, an encoding unit 232 which will be described later is provided on the lower layer of each pixel in the pixel array unit 230 according to the third embodiment. The encoding unit 232 generates encoded data, and supplies the data to the encoded stream storage unit 117.

Configuration Example of Pixel Array Unit

FIG. 19 is an example of a cross-sectional view of the pixel array unit 230 according to the third embodiment. The pixel array unit 230 further includes the encoding unit 232. The encoding unit 232 is arranged on a face which faces a light receiving face in the pixel array unit 230, and pixels 231 are respectively arranged on the upper layer of the encoding unit 232.

The respective pixels 231 generate pixel signals, and output the signals to the encoding unit 232.

The encoding unit 232 converts the respective pixel signals into digital pixel data, and performs encoding of image data which is formed of the pixel data.

Since the encoding unit 232 which is a circuit performing each function of the AD conversion unit 113, the image compression unit 114, the code amount calculation unit 115, and the compression rate determination unit 116 is arranged inside the imaging element 202, it is possible to perform downsizing of the imaging apparatus 100, remarkably. In addition, it is possible to reduce power consumption of the imaging apparatus 100.

In addition, since the encoding unit 232 can perform encoding of a pixel signal from the photoelectric conversion layer 320 immediately, it is possible to execute extremely high-speed encoding processing. In addition, it is possible to execute a series of processes from imaging and encoding of an image in one chip.

In this manner, according to the third embodiment, since the imaging element 202 further includes the encoding unit 232 which performs encoding of an image, it is possible to miniaturize the imaging apparatus 100. In addition, it is possible to reduce power consumption of the imaging apparatus 100.

In addition, the above described embodiments illustrate examples for embodying the present technology, and matters in the embodiments and matters defining the present technology in claims correspond to each other. Similarly, the matters defining the present technology in claims and a matter in the embodiment of the present technology with the same name correspond to each other. However, the present technology is not limited to embodiments, and can be embodied by performing various modifications with respect to the embodiment without departing from the scope of the present technology.

In addition, the processing procedure described in the above-described embodiments may be taken as a method including these series of procedures, and may be taken as a program for executing the series of procedures in a computer, and as a recording medium which stores the program. As the recording medium, it is possible to use a Compact Disc (CD), a MiniDisc (MD), a Digital Versatile Disc (DVD) a memory card, a Blu-ray (registered trademark) Disc, or the like, for example.

In addition, effects described herein are not necessarily limited, and may be any one of effects which are described in the disclosure.

In addition, the present technology can also be configured as follows.

(1) An imaging element which includes a laminated plurality of photoelectric conversion units, and an input light reflecting unit which reflects light beams input from the plurality of photoelectric conversion units toward directions of the plurality of photoelectric conversion units.

(2) The imaging element which is described in (1), in which the respective plurality of photoelectric conversion units convert a part of light beams among light beams with different wavelength regions from each other into an electrical signal as target light, and transmit light beams other than the target light.

(3) The imaging element which is described in (2), in which a reflecting unit between photoelectric conversion units which is arranged between two photoelectric conversion units which are neighboring among the plurality of photoelectric conversion units, reflects light in a wavelength region corresponding to a far photoelectric conversion unit which is further from the input light reflecting unit among the two photoelectric conversion units toward a direction of the far photoelectric conversion unit as reflected light, and transmits light other than the reflected light is further included.

(4) The imaging element which is described in (2) or (3), in which the input light reflecting unit reflects light in the wavelength region corresponding to the photoelectric conversion unit which is closest to the input light reflecting unit.

(5) The imaging element which is described in any one of (2) to (4), in which the laminated plurality of photoelectric conversion units are arranged in a plurality of pixels, respectively, and the plurality of photoelectric conversion units output the electric signals which denote respective luminances of a plurality of colors as pixel signals in each of the pixels.

(6) The imaging element which is described in (5), in which a pixel addition unit which adds up the pixel signals output from the pixels of a predetermined number, which are neighboring, is further included.

(7) The imaging element which is described in (5) or (6), in which an encoding unit which performs encoding of an image which is formed of the pixel signals is further included.

(8) The imaging element which is described in any one of (1) to (7), in which the input light reflecting unit contains a material of which reflectivity is higher than a predetermined value.

(9) The imaging element which is described in (8), in which the input light reflecting unit contains guanine as the material.

(10) The imaging element which is described in (8), in which the input light reflecting unit contains aluminum as the material.

(11) An imaging apparatus which includes a laminated plurality of photoelectric conversion units, an input light reflecting unit which reflects light beams input from the plurality of photoelectric conversion units toward directions of the plurality of photoelectric conversion units, and a storage unit which stores an image formed of electric signals which are converted from light beams using the plurality of photoelectric conversion units.

It should be understood by those skilled in the art that various modifications, combinations, sub-combinations and alterations may occur depending on design requirements and other factors insofar as they are within the scope of the appended claims or the equivalents thereof.

What is claimed is:

1. An image sensor, comprising:
   a first organic photoelectric conversion region configured to convert light in a first wavelength range, the first organic photoelectric conversion region having a first peak spectral sensitivity;
   a second organic photoelectric conversion region configured to convert light in a second wavelength range, the second organic photoelectric conversion region having a second peak spectral sensitivity;
   a third organic photoelectric conversion region configured to convert light in a third wavelength range, the third organic photoelectric conversion region having a third peak spectral sensitivity; and
   a charge reading circuit configured to read charges from at least one selected from the first organic photoelectric conversion region, the second organic photoelectric conversion region, and the third organic photoelectric conversion region,
   wherein the first, second, and third peak spectral sensitivities are different from one another,
   wherein the first, second, and third organic photoelectric conversion regions are stacked in a vertical direction, and
   wherein the charge reading circuit is configured to transmit light in a whole wavelength region including the first, second and third wavelength ranges.

2. The image sensor according to claim 1, wherein the charge reading circuit includes a floating diffusion and a transistor.

3. The image sensor according to claim 1, wherein the wavelengths in the first wavelength range are smaller than wavelengths in the second and third wavelength ranges, and wavelengths in the third wavelength range are larger than wavelengths in the first and second wavelength ranges.

4. The image sensor according to claim 1, wherein
   the charge reading circuit includes a first charge reading circuit region, a second charge reading circuit region, and a third charge reading circuit region,
   the first charge reading circuit region is configured to read charges from the first organic photoelectric conversion region,
   the second charge reading circuit region is configured to read charges from the second organic photoelectric conversion region, and
   the third charge reading circuit region is configured to read charges from the third organic photoelectric conversion region.

5. The image sensor according to claim 4, wherein the first organic photoelectric conversion region, the first charge reading circuit region, the second organic photoelectric conversion region, the second charge reading circuit region, the third organic photoelectric conversion region, and the third charge reading circuit region are stacked in this order in the vertical direction from a light-incident side.

6. The image sensor according to claim 5, further comprising a reflecting region stacked on a side of the third charge reading circuit opposite to the light-incident side.

7. The image sensor according to claim 6, wherein the reflecting region includes aluminum or guanine.

8. The image sensor according to claim 1, further comprising a microlens disposed on one of the first organic photoelectric conversion region, the second organic photoelectric conversion region, or the organic photoelectric conversion region on a light-incident side.

9. An image sensor, comprising:
   a first photoelectric conversion region configured to convert light in a blue wavelength range;
   a second photoelectric conversion region configured to convert light in a green wavelength range;
   a third photoelectric conversion region configured to convert light in a red wavelength range; and
   a charge reading circuit configured to read charges from at least one selected from the first photoelectric conversion region, the second photoelectric conversion region, and the third photoelectric conversion region,
   wherein the first, second, and third photoelectric conversion regions are stacked in this order in a vertical direction from a light-incident side, and
   wherein the charge reading circuit is configured to transmit light in a whole wavelength region including the blue, green, and red wavelength ranges.

10. The image sensor according to claim 9, wherein at least one selected from the first, second, and third photoelectric conversion regions includes a respective organic material.

11. The image sensor according to claim 9, wherein the charge reading circuit includes a floating diffusion and a transistor.

12. The image sensor according to claim 9, wherein the charge reading circuit includes a first charge reading circuit region, a second charge reading circuit region, and a third charge reading circuit region,
the first charge reading circuit region is configured to read charges from the first photoelectric conversion region,
the second charge reading circuit region is configured to read charges from the second photoelectric conversion
the third charge reading circuit region is configured to read charges from the third photoelectric conversion region.

13. The image sensor according to claim 12, wherein the first photoelectric conversion region, the first charge reading circuit region, the second photoelectric conversion region, the second charge reading circuit region, the third photoelectric conversion region, and the third charge reading circuit region are stacked in this order in the vertical direction from the light-incident side.

14. The image sensor according to claim 13, further comprising a reflecting region stacked on a side of the third charge reading circuit opposite to the light-incident side.

15. An image sensor, comprising:
a first photoelectric conversion region configured to convert light in a blue wavelength range;
a second photoelectric conversion region configured to convert light in a green wavelength range;
a third photoelectric conversion region configured to convert light in a red wavelength range; and
a charge reading circuit configured to read charges from at least one selected from the first photoelectric conversion region, the second photoelectric conversion region, and the third photoelectric conversion region,
wherein the first, second, and third photoelectric conversion regions are stacked in a vertical direction, and
wherein the charge reading circuit is configured to transmit light in a whole wavelength region including the blue, green, and red wavelength ranges.

16. The image sensor according to claim 15, wherein at least one selected from the first, second, and third photoelectric conversion regions includes a respective organic material.

17. The image sensor according to claim 15, wherein the first, second, and third photoelectric conversion regions are stacked in this order in the vertical direction from a light-incident side.

18. The image sensor according to claim 15, wherein the charge reading circuit includes a floating diffusion and a transistor.

19. The image sensor according to claim 15, wherein
the charge reading circuit includes a first charge reading circuit region, a second charge reading circuit region, and a third charge reading circuit region,
the first charge reading circuit region is configured to read charges from the first photoelectric conversion region,
the second charge reading circuit region is configured to read charges from the second photoelectric conversion region, and
the third charge reading circuit region is configured to read charges from the third photoelectric conversion region.

20. The image sensor according to claim 19, wherein the first photoelectric conversion region, the first charge reading circuit region, the second photoelectric conversion region, the second charge reading circuit region, the third photoelectric conversion region, and the third charge reading circuit region are stacked in this order in the vertical direction from a light-incident side.

* * * * *